(12) United States Patent
Varadarajan

(10) Patent No.: US 12,283,332 B2
(45) Date of Patent: Apr. 22, 2025

(54) MEMORY BIST CIRCUIT AND METHOD

(71) Applicant: TEXAS INSTRUMENTS INCORPORATED, Dallas, TX (US)

(72) Inventor: Devanathan Varadarajan, Allen, TX (US)

(73) Assignee: Texas Instruments Incorporated, Dallas, TX (US)

( * ) Notice: Subject to any disclaimer, the term of this patent is extended or adjusted under 35 U.S.C. 154(b) by 121 days.

(21) Appl. No.: 18/057,801

(22) Filed: Nov. 22, 2022

(65) Prior Publication Data

US 2024/0170083 A1 May 23, 2024

(51) Int. Cl.
| | |
|---|---|
| G11C 7/00 | (2006.01) |
| G11C 29/12 | (2006.01) |
| G11C 29/18 | (2006.01) |
| G11C 29/46 | (2006.01) |

(52) U.S. Cl.
CPC .......... *G11C 29/1201* (2013.01); *G11C 29/18* (2013.01); *G11C 29/46* (2013.01)

(58) Field of Classification Search
CPC ...................................................... G11C 29/04
USPC ......................................................... 365/201
See application file for complete search history.

(56) References Cited

U.S. PATENT DOCUMENTS

| | | | |
|---|---|---|---|
| 4,782,487 A | 11/1988 | Smelser | |
| 5,745,500 A | 4/1998 | Damarla | |
| 5,883,843 A | 3/1999 | Hii et al. | |
| 5,923,599 A | 7/1999 | Hii et al. | |
| 6,052,320 A | 4/2000 | Kwak | |
| 6,353,563 B1 | 3/2002 | Hii et al. | |
| 6,801,461 B2 | 10/2004 | Hii et al. | |
| 6,898,749 B2 | 5/2005 | Whetsel et al. | |
| 7,308,621 B2 | 12/2007 | Adams et al. | |
| 7,834,615 B2 | 11/2010 | Jarboe, Jr. et al. | |
| 8,667,260 B2 | 3/2014 | Eichenberger et al. | |
| 9,646,716 B2 | 5/2017 | Goessel et al. | |
| 10,600,495 B2 | 3/2020 | Varadarajan et al. | |
| 11,217,323 B1 | 1/2022 | Sharma et al. | |
| 11,500,575 B2 | 11/2022 | Shin | |

(Continued)

OTHER PUBLICATIONS

International Search Report for PCT/US2023/037124, dated Mar. 21, 2024.

(Continued)

*Primary Examiner* — Hoai V Ho

(74) *Attorney, Agent, or Firm* — Xianghui Huang; Frank D. Cimino

(57) ABSTRACT

An electronic circuit includes: a memory including a data input, an address input, a command input, and a data output; a register having a data input coupled to the data output of the memory; a comparator circuit having a first data input coupled to the data output of the memory, and a second data input coupled to a data output of the register; an inverter circuit having a data input coupled to the data output of the register, and a data output coupled to the data input of the memory; and a controller having a command output coupled to the command input of the memory, an address output coupled to the address input of the memory, and a fault input coupled to a data output of the comparator circuit, where the controller is configured to determine whether the memory has a fault based on the fault input of the controller.

25 Claims, 13 Drawing Sheets

(56) References Cited

U.S. PATENT DOCUMENTS

| | | |
|---|---|---|
| 2003/0051197 A1 | 3/2003 | Evans |
| 2003/0222283 A1 | 12/2003 | Takazawa et al. |
| 2005/0144525 A1 | 6/2005 | Heragu et al. |
| 2005/0257107 A1 | 11/2005 | Kim |
| 2006/0242521 A1 | 10/2006 | Hii et al. |
| 2008/0098269 A1 | 4/2008 | Bhavsar et al. |
| 2008/0209294 A1 | 8/2008 | Brink et al. |
| 2008/0235547 A1 | 9/2008 | Chan |
| 2008/0320351 A1 | 12/2008 | Whetsel et al. |
| 2009/0013228 A1 | 1/2009 | Jarboe, Jr. et al. |
| 2009/0077441 A1 | 3/2009 | Huynh et al. |
| 2009/0204861 A1 | 8/2009 | Cleavelin et al. |
| 2010/0131748 A1 | 5/2010 | Lin |
| 2010/0229056 A1 | 9/2010 | Cleavelin et al. |
| 2011/0026343 A1 | 2/2011 | Jarboe, Jr. et al. |
| 2011/0176374 A1 | 7/2011 | Jarboe, Jr. et al. |
| 2013/0275822 A1 | 10/2013 | Damodaran et al. |
| 2014/0164856 A1 | 6/2014 | Damodaran et al. |
| 2014/0189450 A1 | 7/2014 | Varadrajan et al. |
| 2015/0067426 A1 | 3/2015 | Nardini et al. |
| 2015/0235714 A1 | 8/2015 | Ko et al. |
| 2015/0262709 A1 * | 9/2015 | Anzou ................. G11C 7/1006 365/189.07 |
| 2016/0180966 A1 | 6/2016 | Lee |
| 2016/0365156 A1 | 12/2016 | Busi et al. |
| 2017/0125125 A1 | 5/2017 | Narayanan et al. |
| 2017/0157524 A1 | 6/2017 | Narayanan et al. |
| 2018/0173651 A1 | 6/2018 | Xie et al. |
| 2018/0374556 A1 | 12/2018 | Varadarajan et al. |
| 2019/0138408 A1 | 5/2019 | Menon et al. |
| 2019/0227122 A1 | 7/2019 | Simpson et al. |
| 2020/0275137 A1 | 8/2020 | Chang et al. |
| 2022/0068428 A1 | 3/2022 | Paik |
| 2023/0211674 A1 | 7/2023 | Cronin |

OTHER PUBLICATIONS

Davanathan et al., "A Reconfigurable Built-in Memory Self-repair Architecture for Heterogeneous Cores with Embedded BIST Datapath", 2016 IEEE International Test Conference, Nov. 2016, 6 pages.

International Search Report in corresponding PCT Application No. PCT/US2023/010020, mailed May 4, 2023.

Pateras, Stephen, Electronic Design, "Nondestructive memory DIST for runtime automotive test", https://www.electronicdesign.com/technologies/test-measurement/article/21208496/nondestructive-memory-bist-for-runtime-automotive-test, Jun. 21, 2018, 10 pgs.

Varadarajan, Devanathan, U.S. Appl. No. 17/900,551, "Methods and Apparatus to Characterize Memory", filed Aug. 31, 2022.

* cited by examiner

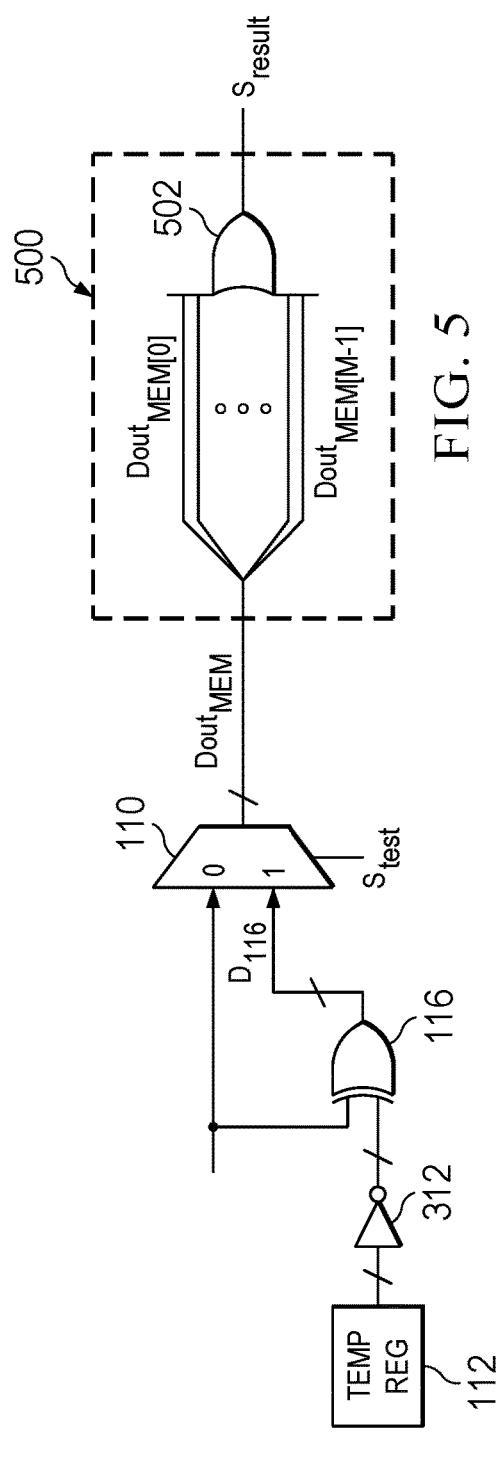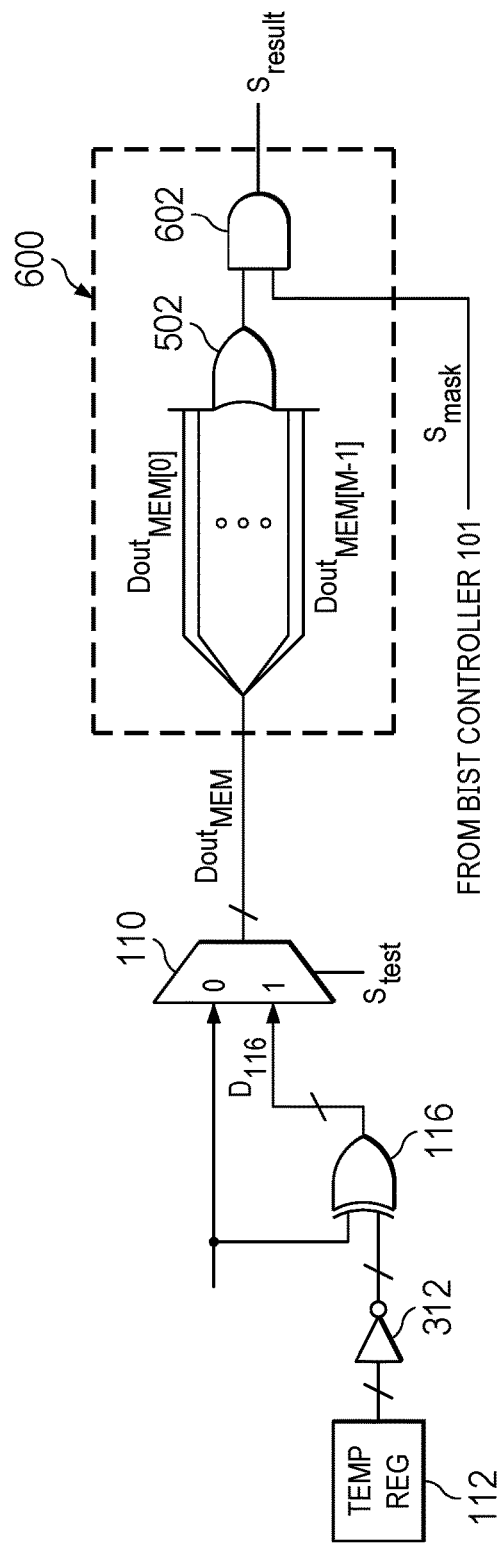

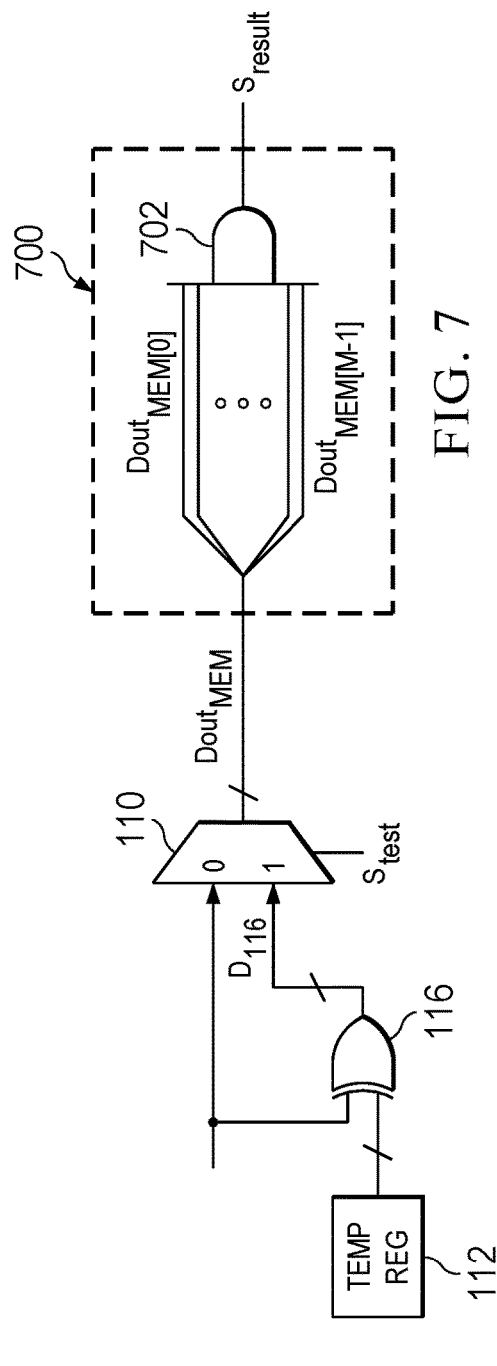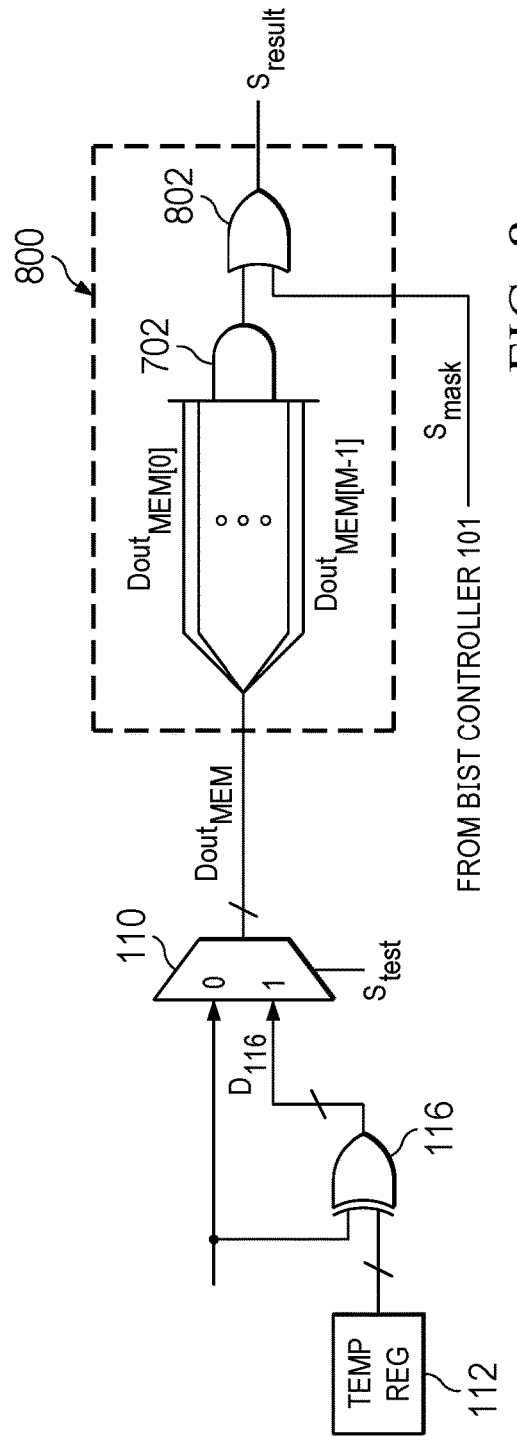
FIG. 7
FIG. 8

MEMORY BIST CIRCUIT AND METHOD

TECHNICAL FIELD

The present disclosure relates generally to an electronic system and method, and, in particular embodiments, to a memory built-in self-test (BIST) circuit and method.

BACKGROUND

BIST circuits are generally used for automated testing of target circuits during product manufacturing and/or during circuit operation. Many BIST circuits include a controller that produces test conditions for one or more target circuits, and receives responses of the one or more target circuits to identify faults in such target circuits.

BIST circuits may be used to help achieve compliance with some safety requirements in some industries. For example, the ISO 26262 functional safety for road vehicles standard defines four automotive safety integrity levels (ASILs) that dictate the integrity requirements of a product, with ASIL-D being associated with the highest safety standard of the four. As an example, to comply with ASIL-D, the latent fault metric of a device (which measures the robustness of the design to latent faults) should have a test coverage of at least 90%.

A memory BIST (MBIST or MEMBIST) circuit is an example of a BIST circuit for testing memories. An MBIST circuit may test a memory (also referred to as perform an MBIST test) to check for stuck-at faults, transition delay faults, coupling faults, neighborhood pattern sensitive faults, etc. For example, an MBIST circuit may write a set of data to a first memory address of the memory, read the set of data from the first memory address of the memory, and compare the set of data as written with the set of data as read. If the read data is different from the write data, the MBIST circuit determines that a fault associated with the memory cells of the first memory exist.

In automotive applications, a memory test may be performed at key-on (during vehicle startup), at key-off (during vehicle power down), and/or during operation. When performing a memory test during operation, the system software running in a processor of the vehicle first saves the state of the target memory, then the system software allows the MBIST circuit to test the target memory, and after the MBIST circuit finishes testing the target memory (which erases the original data stored in the target memory), the system software restores the saved memory state to the target memory for continuing operations.

SUMMARY

In accordance with an embodiment, an electronic circuit includes: a memory including a data input, an address input, a command input, and a data output; a register having a data input coupled to the data output of the memory; a comparator circuit having a first data input coupled to the data output of the memory, and a second data input coupled to a data output of the register; an inverter circuit having a data input coupled to the data output of the register, and a data output coupled to the data input of the memory; and a controller having a command output coupled to the command input of the memory, an address output coupled to the address input of the memory, and a fault input coupled to a data output of the comparator circuit, where the controller is configured to determine whether the memory has a fault based on the fault input of the controller.

In accordance with an embodiment, an apparatus includes: a memory including a data input, an address input, a command input, and a data output; a register having a data input coupled to the data output of the memory; a comparator circuit having a first data input coupled to the data output of the memory, and a second data input coupled to a data output of the register; an inverter circuit having a data input coupled to the data output of the register, and a data output coupled to the data input of the memory; a controller having a command output coupled to the command input of the memory, an address output coupled to the address input of the memory, and a fault input coupled to a data output of the comparator circuit; a first multiplexer having a first data input coupled to the data output of the inverter circuit, and a data output coupled to the data input of the memory; a second multiplexer having a first address input coupled to the address output of the controller, and an address output coupled to the address input of the memory; and a third multiplexer having a first command input coupled to the command output of the controller, and a command output coupled to the command input of the memory; and a processor including: a data output coupled to a second data input of the first multiplexer; an address output coupled to a second address input of the second multiplexer; a command output coupled to a second command input of the third multiplexer; and a data input coupled to the data output of the memory.

In accordance with an embodiment, a method includes: asserting a test mode signal; after the test mode signal is asserted, transmitting a first memory address and a first read command to a first memory to cause the first memory to output first read data at a data output of the first memory; after transmitting the first read command to the first memory, storing the first read data into a first register; after storing the first read data into the first register, transmitting a first write command to the first memory to cause first input data at a data input of the first memory to be stored at the first memory address of the first memory, where the data input of the first memory is coupled to a data output of the first register via a first inverter circuit, and where the first input data corresponds to inverted first read data; after transmitting the first write command to the first memory, transmitting a second read command to the first memory to cause the first memory to output second read data at the data output of the first memory, where the second read data corresponds to the inverted first read data; and after transmitting the second read command to the first memory, comparing the first read data with the second read data using a first comparator circuit that includes a first data input coupled to the data output of the first memory, a second data input coupled to the data output of the first register, and a data output, and determining whether the first memory has a fault based on the data output of the first comparator circuit.

BRIEF DESCRIPTION OF THE DRAWINGS

For a more complete understanding of the present invention, and the advantages thereof, reference is now made to the following descriptions taken in conjunction with the accompanying drawings, in which:

FIGS. 5 and 6 show schematic diagrams illustrating the BIST datapath of FIG. 3, according to embodiments of the present invention;

FIGS. 7 and 8 show schematic diagrams illustrating the BIST datapath of FIG. 1, according to embodiments of the present invention;

Corresponding numerals and symbols in different figures generally refer to corresponding parts unless otherwise indicated. The figures are drawn to clearly illustrate the relevant aspects of the preferred embodiments and are not necessarily drawn to scale.

DETAILED DESCRIPTION OF ILLUSTRATIVE EMBODIMENTS

Figure 1:
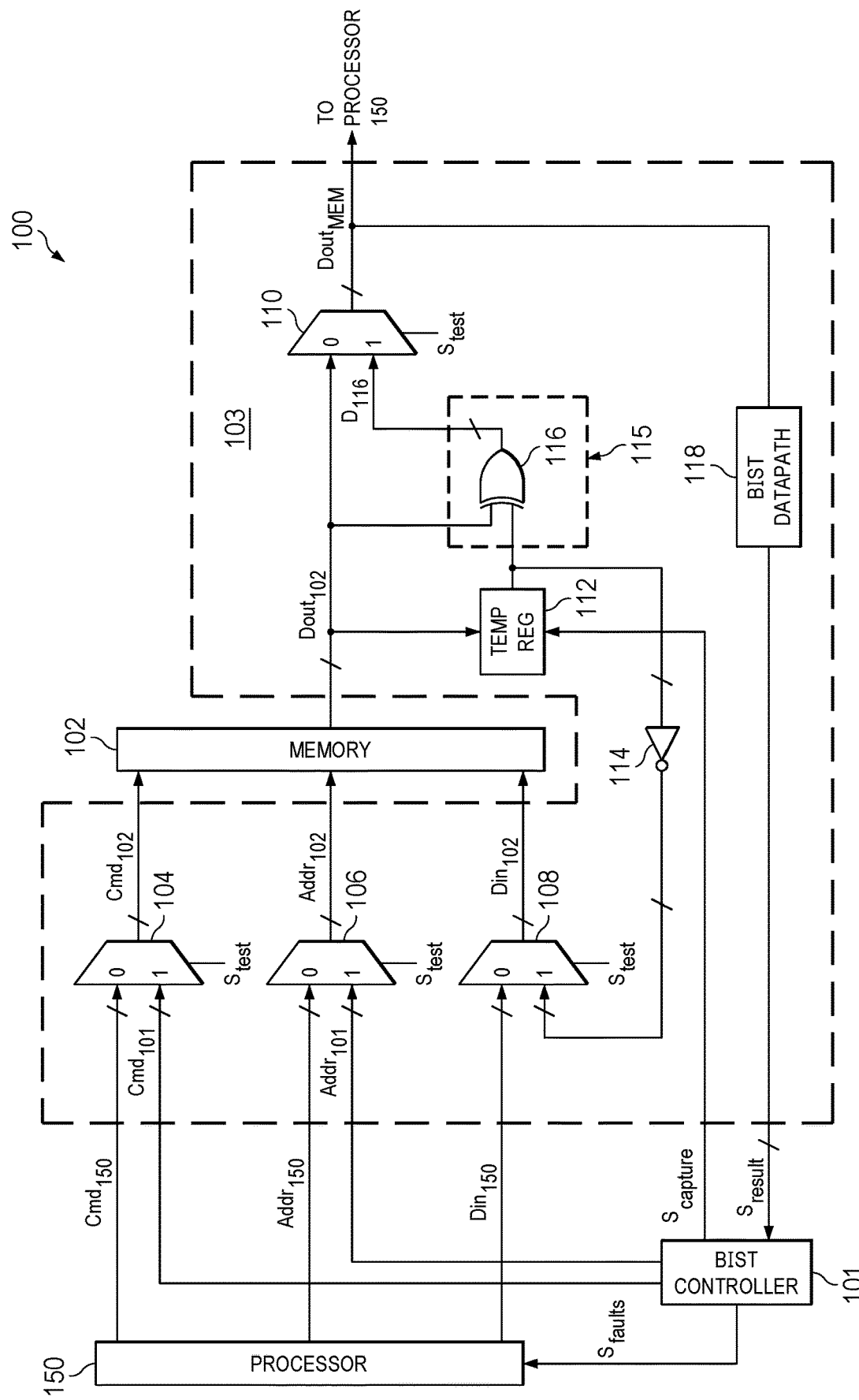
FIGS. 1 and 2 show a schematic diagram of a BIST circuit, and associated waveforms, respectively, according to an embodiment of the present invention.

The making and using of the embodiments disclosed are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The description below illustrates various specific details to provide an in-depth understanding of several example embodiments according to the description. The embodiments may be obtained without one or more of the specific details, or with other methods, components, materials and the like. In some cases, known structures, materials or operations are not shown or described in detail so as not to obscure the different aspects of the embodiments. References to "an embodiment" in this description indicate that a particular configuration, structure or feature described in relation to the embodiment is included in at least one embodiment. Consequently, phrases such as "in one embodiment" that may appear at different points of the present description do not necessarily refer exactly to the same embodiment. Furthermore, specific formations, structures or features may be combined in any appropriate manner in one or more embodiments.

Embodiments of the present invention will be described in specific contexts, a non-destructive memory BIST circuit and method of a system-on-chip (SoC), such as a microcontroller or processor, for automotive applications (e.g., during vehicle operation). Embodiments of the present invention may be used in other types of circuits, such as other circuits that include a memory, such as a volatile or non-volatile memory device. Some embodiments may perform the memory tests, instead or in addition to during vehicle operation, during other times, such as at key-on or key-off. Some embodiments may be used in circuits and devices in applications different from automotive, such as industrial or consumer applications.

In an embodiment of the present invention, a BIST controller is capable of performing non-destructive memory test to a memory, which advantageously allows a processor to cause performance of the memory test by the BIST controller without saving the state of the memory prior to performing the memory test, and without restoring the state of the memory after performing the memory test. In some embodiments, during the memory test, write commands to the memory flip (invert) the content of the memory without intervention from the BIST controller or the processor. In some such embodiments, by sending an even number of write commands to a particular address of the memory, the original data of the particular address is advantageously restored without intervention from the BIST controller or processor. In some embodiments, a fault of the memory is detected by comparing the content of the memory after an odd number of write commands with the content of the memory after an even number of write commands.

In some embodiments, the same write and read commands may be transmitted in parallel to multiple memories, which may advantageously allow a processor to cause performance of a memory test by the BIST controller to test multiple memories in parallel without saving the state of the memories prior to performing the memory test, and without restoring the state of the memories after performing the memory test.

FIG. 1 shows a schematic diagram of BIST circuit 100, according to an embodiment of the present invention. BIST circuit 100 may be used for testing memory 102. BIST circuit 100 includes BIST controller 101, BIST datapath 118, multiplexers (MUXes) 104, 106, 108, and 110, temporary register 112, inverter(s) 114, and comparator circuit 115. Comparator circuit 115 may include XOR gate(s) 116. The circuits that are part of BIST circuit 100, not including BIST controller 101, may be referred to, collectively, as BIST auxiliary circuit 103.

During normal operation (when a test mode signal $S_{test}$ is deasserted, e.g., low in the embodiment illustrated in FIG. 1), processor 150 sends commands (e.g., read, write), memory addresses, and write data to memory 102 and receives read data from memory 102 (depending on the command). For example, when processor 150 sends a read command (via MUX 104) and a memory address (via MUX 106) to memory 102, memory 102 provides, in response to the read command, read data associated with the memory address to processor 150 (via MUX 110). As another example, when processor 150 sends a write command (via MUX 104), a memory address (via MUX 106), and write data (via MUX 108) to memory 102, memory 102 stores, in response to the write command, the write data into the memory location associated with the memory address.

In some embodiments, the word size associated with the read data and the write data is 32 bits. Words of sizes different than 32 bits (e.g., 16 bits or lower, or 64 bis, 128 bits, 256 bits, 512 bits or higher) may also be used.

In some embodiments, temporary register 112 is capable of storing one word of data. For example, if a word of data $Dout_{102}$ has 32 bits, temporary register 112 has 32 bits (or more). Temporary register 112 may be implemented in any way known in the art.

In some embodiments, XOR gate(s) 116 represents a plurality of XOR gates for performing bit-wise XOR operation between the content of temporary register 112 and the content of data $Dout_{102}$. XOR gate(s) 116 may be implemented in any way known in the art.

In some embodiments, inverter gate(s) 114 represents a plurality of inverter gates for performing bit-wise inverting operation of the content of temporary register 112. Inverter gate(s) 114 may be implemented in any way known in the art.

In some embodiments, MUX 110 is configured to perform a multiplexing operation between data $Dout_{102}$ and error data $D_{116}$; MUX 104 is configured to perform a multiplexing operation between command data received from processor 150 and command data received from BIST controller 101;

MUX 106 is configured to perform a multiplexing operation between memory address received from processor 150 and memory address received from BIST controller 101; and MUX 108 is configured to perform a multiplexing operation between read data received from processor 150 and receive data received from inverter gate(s) 114. MUXes 104, 106, 108, and 110 may be implemented in any way known in the art.

During memory test mode (when test mode signal $S_{test}$ is asserted, e.g., high in the embodiment illustrated in FIG. 1), BIST controller 101 can send commands and memory addresses to memory 102, via MUXes 104 and 106, respectively. As shown in FIG. 1, during memory test mode, write data $Din_{102}$ is provided by temporary register 112 (via inverter gate(s) 114). In some embodiments, temporary register 112 is latched with data $Dout_{102}$ upon assertion of capture signal $S_{capture}$.

In some embodiments, BIST controller 101 may be implemented as a generic or custom processor or controller, e.g., coupled to a memory (e.g., external to BIST controller 101 and/or inside BIST controller 101) and configured to execute instructions stored in such memory. For example, in some embodiments, BIST controller 101 may include one or more, generic or custom, of a field programmable gate array (FPGA) that may instantiate instructions, a central processor unit (CPU), a graphic processor unit (GPU), a digital signal processor (DSP). In some embodiments, BIST controller 101 may include a finite state machine (FSM). Other implementations are also possible.

In some embodiments, processor 150 may be implemented as a generic or custom processor. In some embodiments, processor 150 is configured to execute instructions stored in memory 102. In some embodiments, processor 150 is configured to process data stored in memory 102.

In some embodiments, memory 102 may be implemented as a volatile or non-volatile memory. For example, in some embodiments, memory 102 may be implemented as a synchronous dynamic random access memory (SDRAM), dynamic random access memory (DRAM), RAMBUS® dynamic random access memory (RDRAM®), and/or any other type of RAM memory, flash memory (such as NAND-based flash memory or NOR-based flash memory), phase-change memory (PCM), resistive random access memory (RRAM), magnetoresistive random-access memory (MRAM), etc.

Figure 2:
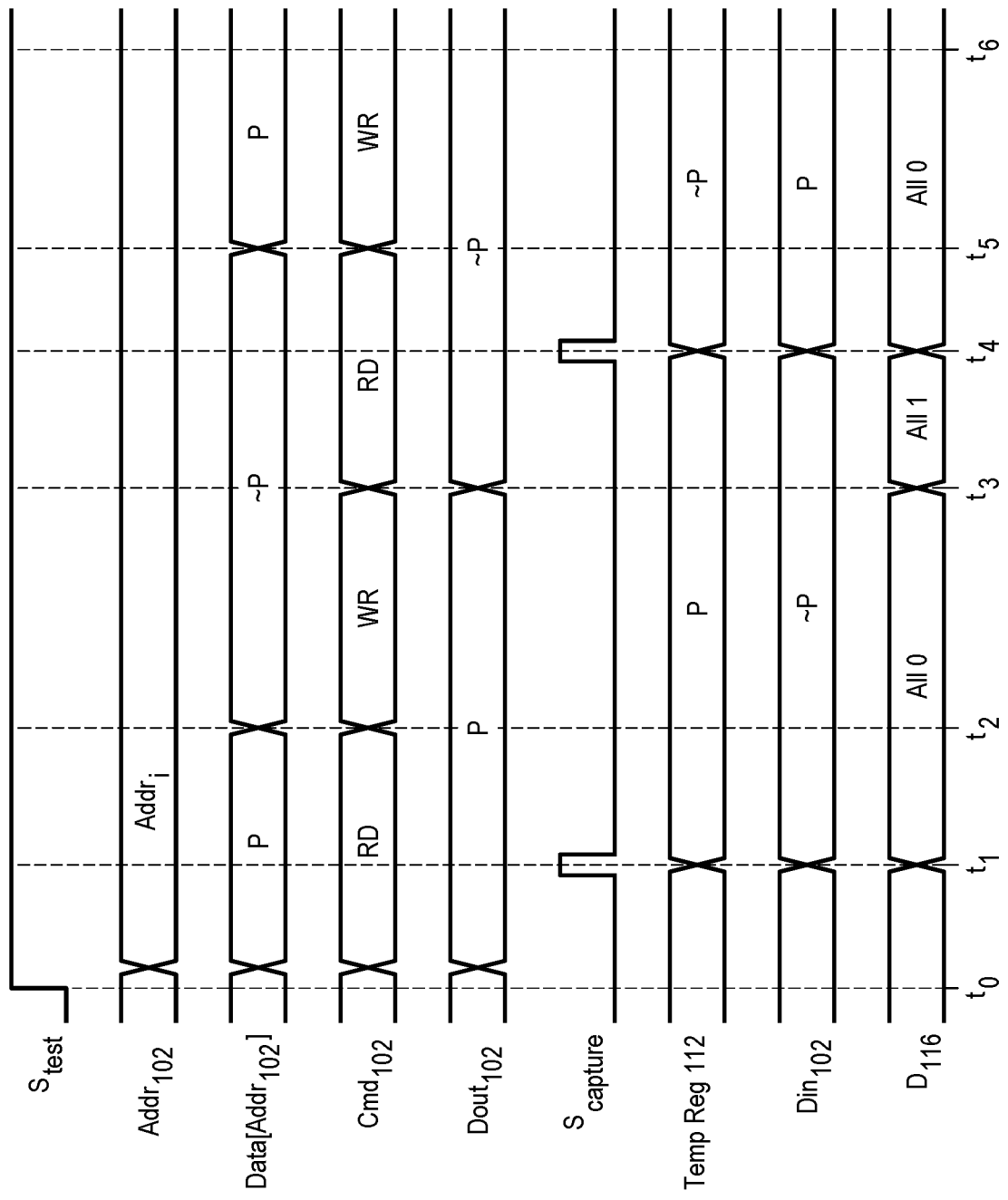

In some embodiments, MBIST circuit 100 may be used for non-destructive memory test. For example, FIG. 2 illustrates waveforms associated with testing the memory cells of the memory word located at address $Addr_i$ of memory 102 in a non-destructive manner, according to an embodiment of the present invention. FIG. 2 may be understood in view of FIG. 1.

As shown in FIG. 2, when MBIST circuit 100 enters memory test mode at time to (when signal $S_{test}$ is asserted), the data stored at location $Addr_i$ of memory 102 is P. After a first read command (which makes available data P to data $Dout_{102}$) and a first capture pulse (which causes temporary register 112 to latch data $Dout_{102}$), the data P is stored in temporary register 112 at time $t_1$. After a first write command, the inverted data ~P (received at data $Din_{102}$ from inverter gate(s) 114 via MUX 108) is stored at location $Addr_i$ of memory 102 at time $t_2$. After a second read command and a second capture pulse, the data ~P is stored in temporary register 112 at time $t_4$. After a second write command, the original data P is stored again at location $Addr_i$ of memory 102 at time $t_5$.

As illustrated in FIG. 2, if the number of write commands to a particular address of memory 102 is even during memory test mode, the memory cells associated with the particular memory address are exercised in a non-destructive manner (the original data is restored after each pair of write commands). Thus, in some embodiments, different command patterns associated with a particular memory address may be performed (e.g., WRITE, READ, WRITE, READ; WRITE, READ, READ, WRITE, READ, etc.) to exercise the memory cells associated with such particular memory address to perform various memory tests (e.g., stuck-at-1 test, stuck-at-0 test, read disturbed test, etc.) in a non-destructive manner.

FIG. 2 also illustrates in error data $D_{116}$ the behavior of the output of XOR gates(s) 116 when no faults are present. As shown in FIG. 2, between times $t_1$ and $t_3$, the outputs of XOR(s) 116 is 0 (since $Dout_{102}$ is equal to the data stored in temporary register 112, which is equal to the original data P). Between times $t_3$ and $t_4$, the outputs of XOR(s) 116 is all 1 (since $Dout_{102}$ is equal to the inverted data stored in temporary register 112). After time $t_4$, the outputs of XOR(s) 116 is 0 (since $Dout_{102}$ is equal to the data stored in temporary register 112, which is equal to the inverted data ~P). Before time $t_1$, of the outputs of XOR(s) 116 are ignored.

The outputs of the XOR gate(s) 116 deviating from the expected results (e.g., illustrated in FIG. 2) is indicative that a fault associated with address $Addr_i$ is present. Thus, in some embodiments, BIST controller 101 send a series of read and write commands to memory 102, receive the outputs from XOR gate(s) 116 (or a compressed version thereof) via BIST datapath 118 (illustrated as signal $S_{result}$), and compares signal $S_{result}$ with expected values (e.g., in a bitwise manner). If the value of signal $S_{result}$ are different from the expected values, a fault is detected and BIST controller 101 may report the presence of a fault to processor 150 (and/or a conventional fault management circuit), e.g., via signal $S_{fault}$.

In some embodiments, during memory test mode, BIST datapath 118 is configured to deliver error data $D_{116}$ (or a compressed form of error data $D_{116}$) to BIST controller 101. In some embodiments, BIST datapath 118 may be implemented with logic circuits such as buffers, and/or other logic gates.

As shown in FIGS. 1 and 2, error data $D_{116}$ may be generated by XOR gate(s) 116. In some embodiments, different polarities and logic circuits, such as replacing XOR gates 116 with XNOR gates, may be used to generate error data $D_{116}$. The polarity of the expected values of error data $D_{116}$ when no fault is present may also be changed.

In some embodiments, a capture operation (e.g., asserting capture signal $S_{capture}$) may be performed in connection with a read operation (e.g., each time a read command is performed). In some embodiments, a capture operation may be performed at other times, such as in connection with a write operation (e.g., each time a write command is performed).

Figure 3:
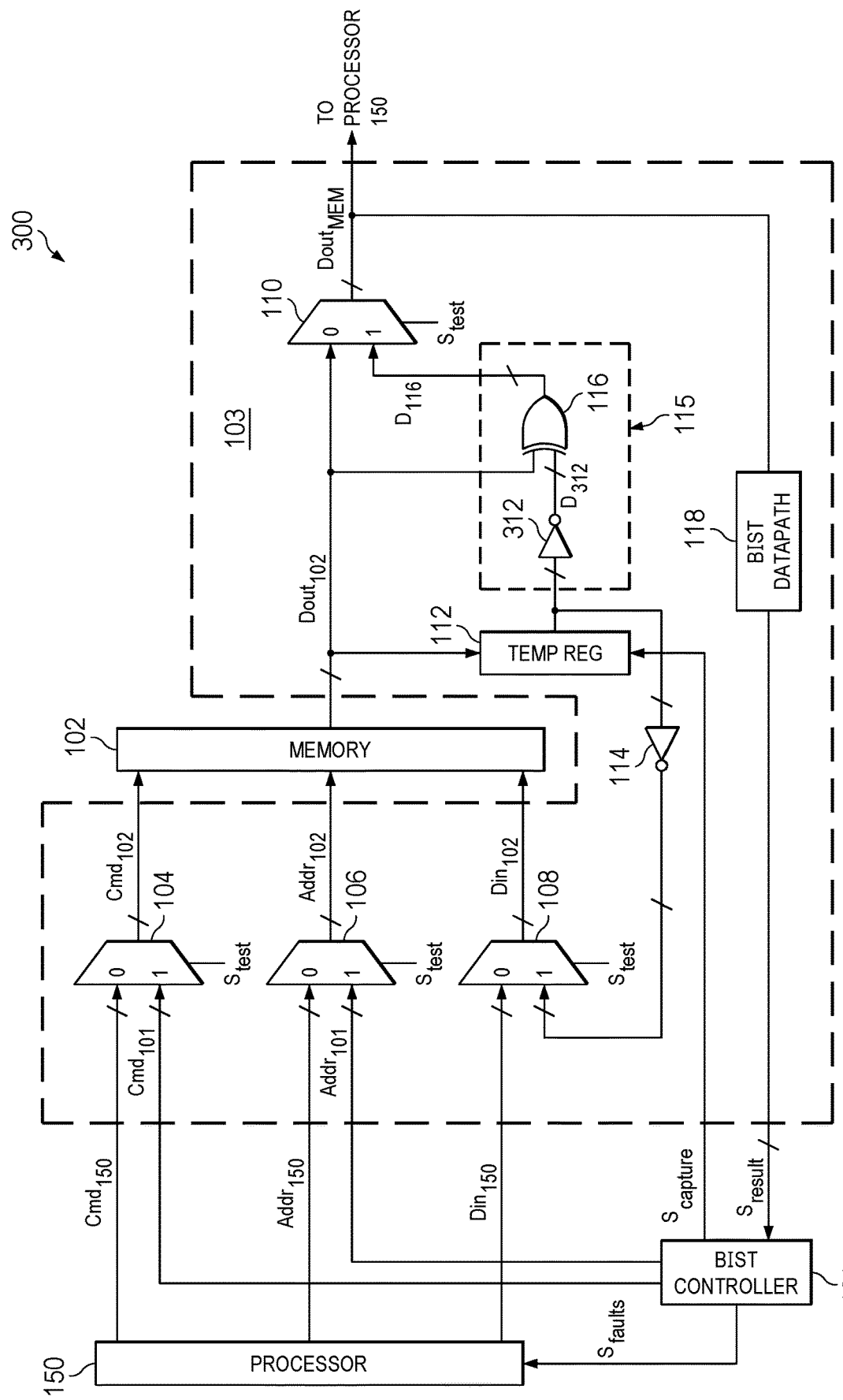
FIGS. 3 and 4 show a schematic diagram of a BIST circuit, and associated waveforms, respectively, according to an embodiment of the present invention.

FIG. 3 shows a schematic diagram of BIST circuit 300, according to an embodiment of the present invention. BIST circuit 300 may be used for testing memory 102. BIST circuit 300 operates in a similar manner as BIST circuit 100. BIST circuit 300, however, includes inverter gate(s) 312 as part of comparator circuit 115.

Figure 4:
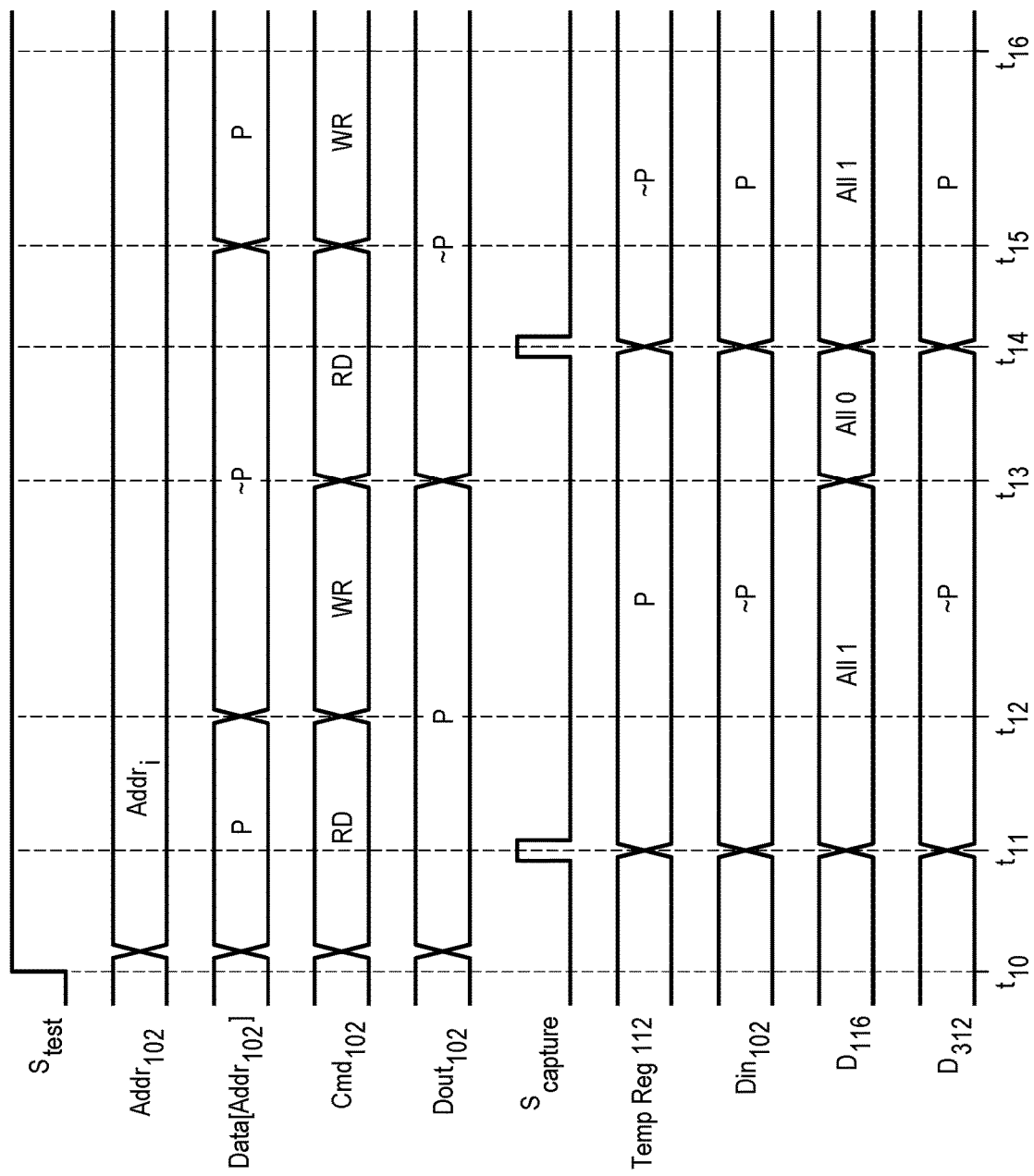

FIG. 4 illustrates waveforms associated with testing the memory cells of the memory word located at address $Addr_i$ of memory 102 in a non-destructive manner, according to an embodiment of the present invention. FIG. 4 may be understood in view of FIG. 3.

As shown, the waveforms illustrated in FIG. 4 are very similar to the waveforms illustrated in FIG. 2. The waveforms of FIG. 4, however, illustrate the output of inverter gate(s) 312 (labeled $D_{312}$), and the expected values of error data $D_{116}$ when no faults are present are different than in FIG. 2 (as a result of the presence of inverter gate(s) 312).

In some embodiments, such as illustrated in FIGS. 1-4, BIST controller may detect a fault when signal $S_{result}$ deviates from the expected value. For example, in the embodiment illustrated in FIGS. 1 and 2, if the value of $S_{result}$ other than all 0 is detected between times $t_1$ and $t_3$, and $t_4$, and $t_6$, or if a value of $S_{result}$ other than all 1 is detected between times $t_3$ and $t_4$, a fault is detected. As another example, in the embodiment of FIGS. 3 and 4, if the value of $S_{result}$ other than all 1 is detected between times $t_{11}$ and $t_{13}$, and $t_{14}$, and $t_{16}$, or if a value of $S_{result}$ other than all 0 is detected between times $t_{13}$ and $t_{14}$, a fault is detected.

In some embodiments, BIST controller 101 is configured to read signal $S_{result}$ and compare signal $S_{result}$ (e.g., in a bitwise manner) with a predetermined value during specific times, such as at times when the signal $S_{result}$ is expected to have a fixed predetermined value (e.g., 0) when no faults are present. For example, in the embodiment illustrated in FIGS. 3 and 4, BIST controller 101 may process signal $S_{result}$ to determine whether there is a fault in memory 102 when the expected values of error data $D_{116}$ is 0 (e.g., between times $t_{13}$ and $t_{14}$) while ignoring signal $S_{result}$ when the expected value of signal $S_{result}$ is 1 (e.g., between times $t_{11}$ and $t_{13}$ and between times $t_{14}$ and $t_{16}$) or is indeterminate (e.g., between times $t_{10}$ and $t_{11}$). By comparing results from signal $S_{result}$ only at times where the expected data is equal to a fixed predetermined value (e.g., all 0 in the embodiment illustrated in FIG. 4), some embodiments may simplify the determination of whether a fault is present as well as the implementation of signal compression in BIST datapath 118. For example, FIG. 5 shows a schematic diagram illustrating BIST datapath 500, according to an embodiment of the present invention. In some embodiments, BIST datapath 118 may be implemented as BIST datapath 500. FIG. 5 may be understood in view of FIGS. 3 and 4.

As shown in FIG. 5, BIST datapath 500 includes OR gate 502, which performs an OR operation of M bits of data $Dout_{MEM}$, where M is the word size associated with memory 102. Thus, in some embodiments, the output bus $Dout_{MEM}$ may be compressed to a single-bit signal $S_{result}$, and BIST controller 101 may use the single-bit signal $S_{result}$ to determine (e.g., at predetermined times, such as between times $t_{13}$ and $t_{14}$) whether a fault is detected.

In some embodiments, OR gate 502 may be implemented in other circuit locations, such as between the output of XOR gate(s) 116 and the input of MUX 110.

In some embodiments, BIST controller 101 determines when to monitor and when to ignore signal $S_{result}$ via software. In some embodiments, a BIST circuit (e.g., 100 or 300) may include a circuit for ignoring error data $D_{116}$ during particular periods of times. For example, FIG. 6 shows a schematic diagram illustrating BIST datapath 600, according to an embodiment of the present invention. In some embodiments, BIST datapath 118 may be implemented as BIST datapath 600. FIG. 6 may be understood in view of FIGS. 3 and 4.

BIST datapath 600 may operate in a similar manner as BIST datapath 500. BIST datapath 600, however, includes AND gate 602, which operates as a masking circuit for masking the output of OR gate 502 based on signal $S_{mask}$ (e.g., when signal $S_{mask}$ is asserted, e.g., low). In some embodiments, signal $S_{mask}$ is generated by BIST controller 101 and is asserted (e.g., high) during time periods in which BIST controller 101 monitors signal $S_{result}$ (e.g., between times $t_{13}$ and $t_{14}$) and is deasserted (e.g., high) during times in which signal $S_{result}$ is ignored (e.g., between times $t_{10}$ to $t_{13}$ and between times $t_{14}$ to $t_{16}$). In some such embodiments, BIST controller 101 may detect whether a fault is present in an asynchronous manner when signal $S_{result}$ is asserted (e.g., when signal $S_{result}$ transitions from low to high in the embodiments illustrated in FIG. 6).

As shown in FIGS. 5 and 6, some embodiments may be used to detect faults when the output of comparator circuit 115 transitions to a predetermined state (e.g., high), which may advantageously allow for compressing the output of comparator circuit 115. Some embodiments may be implemented using a different polarity. For example, FIGS. 7 and 8 show schematic diagrams illustrating BIST datapath 700 and 800, according to embodiments of the present invention. BIST datapath 118 may be implemented as BIST datapath 700 or 800. FIGS. 7 and 8 may be understood in view of FIGS. 1 and 2.

As shown in FIG. 7, at times when the expected value of error data $D_{116}$ is all 1, signal $S_{result}$ becomes 0 if any of the bits of data $Dout_{MEM}$ becomes 0. Thus, in some such embodiments, BIST controller 101 may determine whether a fault is present if signal $S_{result}$ becomes 0.

As shown in FIG. 8, BIST controller 101 may mask the output of AND gate 702 by asserting signal $S_{mask}$ (e.g., high) during time periods in which BIST controller 101 monitors signal $S_{result}$ (e.g., between times $t_3$ and $t_4$) and is deasserted (e.g., low) during times in which signal $S_{result}$ is ignored (e.g., between times $t_0$ to $t_3$ and between times $t_4$ to $t_6$).

Figure 9:
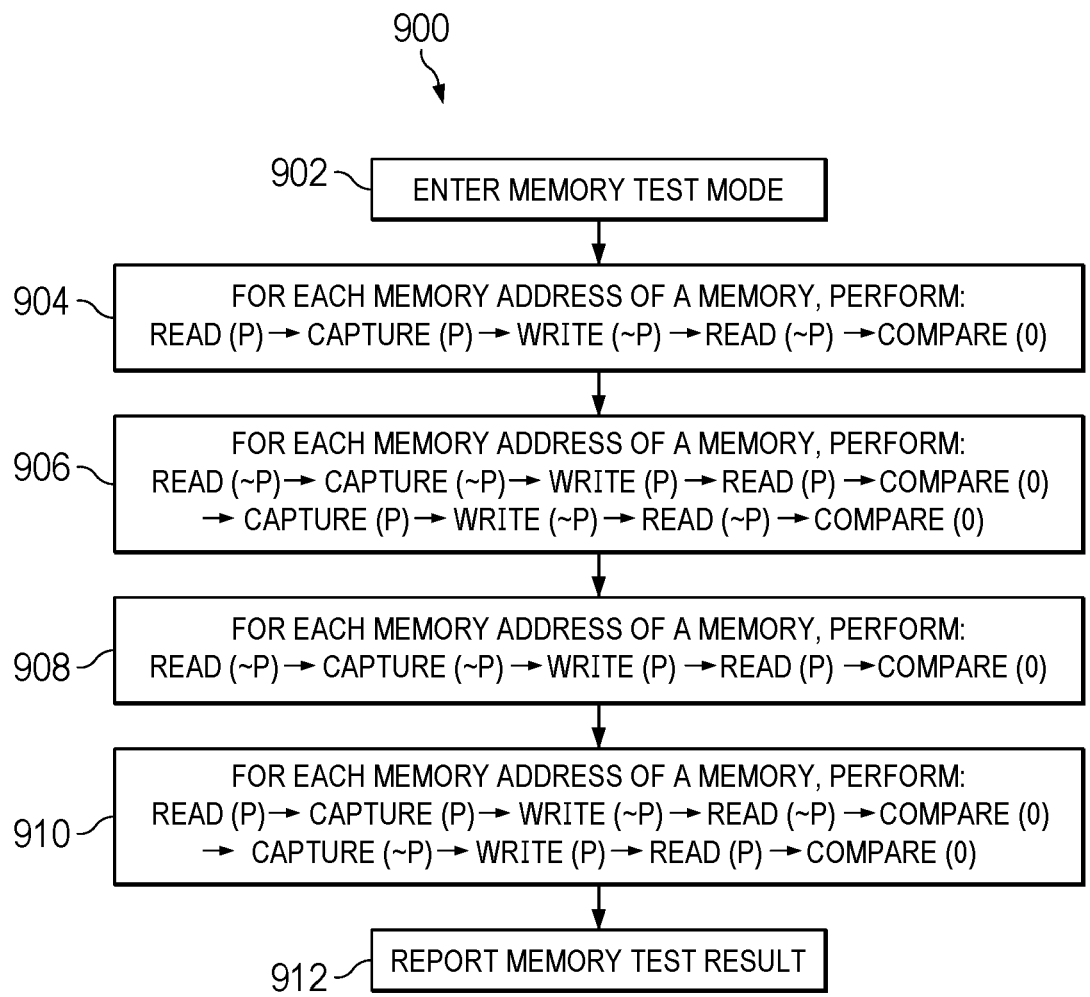
FIGS. 9 to 11 show flow charts of embodiment methods for testing a memory, according to embodiments of the present invention.

FIG. 9 shows a flow chart of embodiment method 900 for testing memory 102, according to an embodiment of the present invention. Method 900 may be performed by BIST controller 101. FIG. 9 may be understood in view of FIG. 3.

As shown in FIG. 9, each of steps 904, 906, 908, and 910 includes various operations (Read, Capture, Write, Compare). For ease of understanding, FIG. 9 shows in parenthesis the expected values of each operation when comparator circuit 115 includes inverter gate(s) 312 (as illustrated in FIG. 3). It is understood that the expected values shown in FIG. 9 are exemplary only, and that different expected values may be used depending on the particular implementation.

Method 900, as illustrated in FIG. 9, is an example of a possible test sequence for testing a memory. It is understood that a different combination of commands (read, write, capture, compare) may be used to test the memory. In some embodiments, method 900 is non-destructive (preserves the original content of the memory) as long as an even (or zero) number of write operations are performed on each memory address of the memory.

During step 902, memory test mode is entered, e.g., by asserting test mode signal $S_{test}$ (e.g., high). In some embodiments, test mode signal $S_{test}$ is asserted by BIST controller 101. In some embodiments, test mode signal $S_{test}$ is asserted by processor 150 (where signal $S_{test}$ is also received by BIST controller 101 and triggers performance of the memory test by BIST controller 101).

During step 904, BIST controller 101 performs, for each memory address of memory 102, the following operations:
transmit a read command to memory 102 (via MUX 104), which causes the original data associated with the current address (labeled as P) to become available in data $Dout_{102}$;
assert the capture signal $S_{capture}$, which causes the data (P) from data $Dout_{102}$ to be stored in temporary register 112;

transmit a write command to memory 102 (via MUX 104), which causes data $\text{Din}_{102}$ (~P) to be stored at the current address;

transmit a read command to memory 102 (via MUX 104), which causes the inverted data (~P) to become available in data $\text{Dout}_{102}$; and read the output of $S_{result}$ (illustrated as a compare command in FIG. 9), which, at this point should be all 0 if no fault is present (since the data at temporary register 112 is P, $D_{312}$ is ~P, and the data at $\text{Dout}_{102}$ is ~P).

In some embodiments, the operations performed for each memory address during step 904 are performed for each memory address in sequentially ascending order.

After step 904 is performed and before step 906 is performed, the content of each memory address of memory 102 is the inverted data (~P) of the original data (P) of the particular memory address (since an odd number of write operations (only a single write operation) have been performed for each memory address at this point).

During step 906, BIST controller 101 performs, for each memory address of memory 102, the following operations:

transmit a read command to memory 102 (via MUX 104), which causes the current data associated with the current address (at this point the inverted original data ~P) to become available in data $\text{Dout}_{102}$;

assert the capture signal $S_{capture}$, which causes the data (~P) from data $\text{Dout}_{102}$ to be stored in temporary register 112;

transmit a write command to memory 102 (via MUX 104), which causes data $\text{Din}_{102}$ (P) to be stored at the current address;

transmit a read command to memory 102 (via MUX 104), which causes the data (P) to become available in data $\text{Dout}_{102}$;

read the output of $S_{result}$ which, at this point should be all 0 if no fault is present (since the data at temporary register 112 is ~P, $D_{312}$ is P, and the data at $\text{Dout}_{102}$ is P);

assert the capture signal $S_{capture}$, which causes the data (P) from data $\text{Dout}_{102}$ to be stored in temporary register 112;

transmit a write command to memory 102 (via MUX 104), which causes data $\text{Din}_{102}$ (~P) to be stored at the current address;

transmit a read command to memory 102 (via MUX 104), which causes the data (~P) to become available in data $\text{Dout}_{102}$; and read the output of $S_{result}$ which, at this point should be all 0 if no fault is present (since the data at temporary register 112 is P, $D_{312}$ is ~P, and the data at $\text{Dout}_{102}$ is ~P).

In some embodiments, the operations performed for each memory address during step 906 are performed for each memory address in sequentially ascending order.

After step 906 is performed and before step 908 is performed, the content of each memory address of memory 102 is the inverted data (~P) of the original data (P) of the particular memory address (since an odd number of write operations (3 write operations) have been performed for each memory address at this point).

During step 908, BIST controller 101 performs, for each memory address of memory 102, the following operations:

transmit a read command to memory 102 (via MUX 104), which causes the inverted data (~P) to become available in data $\text{Dout}_{102}$;

assert the capture signal $S_{capture}$, which causes the data (~P) from data $\text{Dout}_{102}$ to be stored in temporary register 112;

transmit a write command to memory 102 (via MUX 104), which causes data $\text{Din}_{102}$ (P) to be stored at the current address;

transmit a read command to memory 102 (via MUX 104), which causes the data (P) to become available in data $\text{Dout}_{102}$; and read the output of $S_{result}$ (illustrated as a compare command in FIG. 9), which, at this point should be all 0 if no fault is present (since the data at temporary register 112 is ~P, $D_{312}$ is P, and the data at $\text{Dout}_{102}$ is P).

In some embodiments, the operations performed for each memory address during step 908 are performed for each memory address in sequentially descending order.

After step 908 is performed and before step 910 is performed, the content of each memory address of memory 102 is the original data (P) of the particular memory address (since an even number of write operations (4 write operations) have been performed for each memory address at this point).

During step 910, BIST controller 101 performs, for each memory address of memory 102, the following operations:

transmit a read command to memory 102 (via MUX 104), which causes the current data associated with the current address (at this point the original data P) to become available in data $\text{Dout}_{102}$;

assert the capture signal $S_{capture}$, which causes the data (P) from data $\text{Dout}_{102}$ to be stored in temporary register 112;

transmit a write command to memory 102 (via MUX 104), which causes data $\text{Din}_{102}$ (~P) to be stored at the current address;

transmit a read command to memory 102 (via MUX 104), which causes the data (~P) to become available in data $\text{Dout}_{102}$;

read the output of $S_{result}$ which, at this point should be all 0 if no fault is present (since the data at temporary register 112 is P, $D_{312}$ is ~P, and the data at $\text{Dout}_{102}$ is ~P);

assert the capture signal $S_{capture}$, which causes the data (~P) from data $\text{Dout}_{102}$ to be stored in temporary register 112;

transmit a write command to memory 102 (via MUX 104), which causes data $\text{Din}_{102}$ (P) to be stored at the current address;

transmit a read command to memory 102 (via MUX 104), which causes the data (P) to become available in data $\text{Dout}_{102}$; and read the output of $S_{result}$ which, at this point should be all 0 if no fault is present (since the data at temporary register 112 is ~P, $D_{312}$ is P, and the data at $\text{Dout}_{102}$ is P).

In some embodiments, the operations performed for each memory address during step 910 are performed for each memory address in sequentially descending order.

After step 910 is performed, the content of each memory address of memory 102 is the original data of the particular memory address (since an even number of write operations (6 write operations) have been performed for each memory address at this point).

During step 912, if signal $S_{result}$ differs from the expected value (e.g., 0) during any of steps 904, 906, 908, and 910, signal $S_{fault}$ is asserted (e.g., high) to indicate that a fault has been detected (e.g., to processor 150).

In some embodiments, step 912 is performed after step 910 (as illustrated in FIG. 9). In some embodiments, step 912 is performed during performance of steps 904, 906, 908, and 910 (e.g., in some embodiments, faults are reported when detected).

In some embodiments, steps 904 and 906 may be performed for each memory address in sequentially ascending order, and steps 908 and 910 may be performed for each memory address in sequentially descending order. In some embodiments, the operations may be performed in a different order.

As shown in FIG. 9, in some embodiments, BIST controller 101 may perform a capture operation (e.g., assert capture signal $S_{capture}$) before each write command transmitted (also referred to as an early-write-back operation). For example, in some embodiments, executing a write instruction by BIST controller 101, includes asserting capture signal $S_{capture}$, and after asserting capture signal $S_{capture}$, transmitting the write command to memory 102.

In some embodiments, BIST controller 101 is capable of performing two types of read operation: a read-compare operation, and a read-ignore operation. In some embodiments, executing a read-compare instruction, by BIST controller 101, includes transmitting a read command to memory 102, and after transmitting the read command, performing a compare operation to read signal $S_{result}$. In some embodiments, executing a read-ignore instruction, by BIST controller 101 includes transmitting a read command to memory 102 without performing a compare operation after transmitting the read command.

As an illustrative example, in some embodiments that implement a write instruction that includes an early-write-back, a read-compare instruction, and a read-ignore instruction, the sequence of operations illustrated in step 904 may be obtained by BIST controller 101 executing the following instructions for each memory address:
   read-ignore instruction;
   write instruction;
   read-compare instruction.

Figure 10:
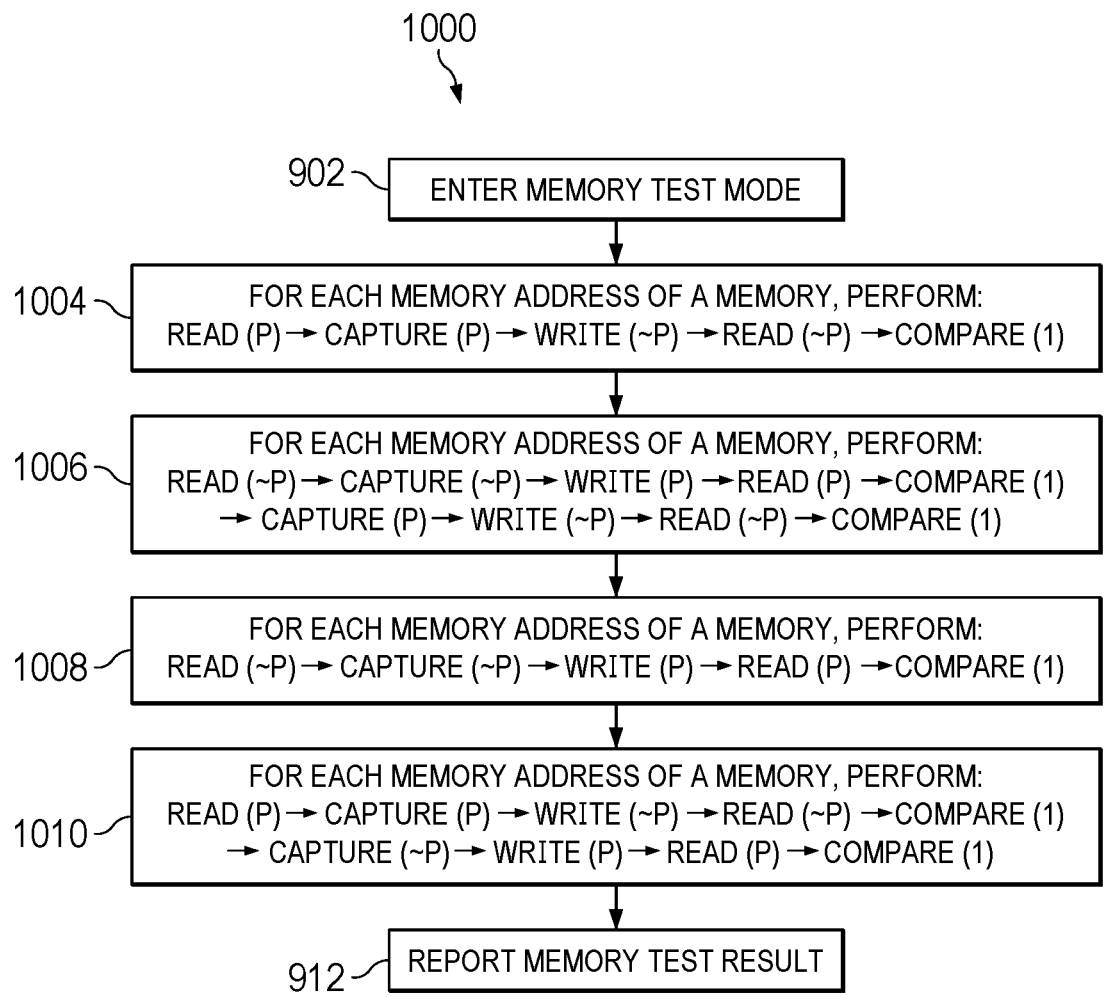

FIG. 10 shows a flow chart of embodiment method 1000 for testing memory 102, according to an embodiment of the present invention. Method 1000 may be performed by BIST controller 101. FIG. 10 may be understood in view of FIG. 1.

Method 10 includes steps 902, 1004, 1006, 1008, 1010, and 912. Method 1000 is very similar to method 900. Method 1000, however, illustrates different expected values (1) during a compare operation of steps 1004, 1006, 1008, and 1010, due to the absence of inverter gate(s) 312 in BIST circuit 100.

Figure 11:
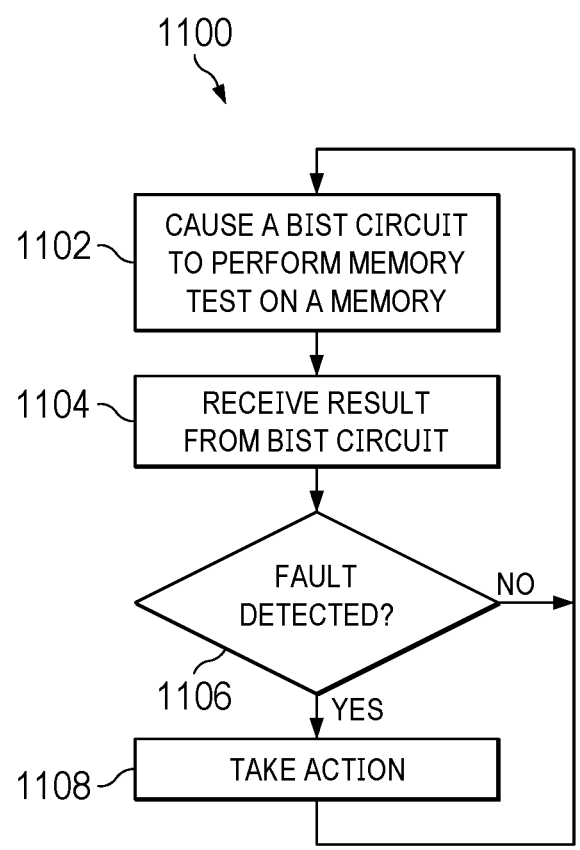

FIG. 11 illustrates a flow chart of embodiment method 1100 for performing a memory test, according to an embodiment of the present invention. Method 1100 may be implemented, e.g., by processor 150.

During step 1102, a processor (e.g., 150) causes a BIST circuit (e.g., 100 or 300) to perform a memory test (e.g., 900 or 1000) on a memory (e.g., 102). In some embodiments, the processor causes the BIST circuit to perform the memory test by asserting a test mode signal $S_{test}$. In some embodiments, the processor triggers the performance of the memory test by BIST controller 101, e.g., using one or more (e.g., digital) signals, such as using a conventional digital communication interface coupled to BIST circuit 101.

During step 1104, the processor receives from the BIST circuit an indication (e.g., via signal $S_{fault}$) of whether a fault has been detected in memory 102. In some embodiments, the processor receives the fault indication via a conventional digital communication interface coupled to BIST controller 101.

If a fault is detected during step 1106 based on the result received from the BIST circuit (output "yes"), the processor takes an action, such as entering safe mode, reporting an error to an external user (e.g., such as an external processor or controller), storing the fault in a log, etc.

As shown in FIG. 11, steps 1102, 1104, and 1106 may be performed, multiple times, such as during power up (e.g., at key-on a vehicle application), power down (e.g., at key-off in a vehicle application), on demand (e.g., by an external user), and/or at predetermined (e.g., fixed) time intervals.

As illustrated in FIG. 11, processor 150 may cause the performance of a memory test on memory 102 without incurring overhead for saving the state of memory 102 before performance of the memory test or restoring the state of memory 102 after performance of the memory test.

Figure 12:
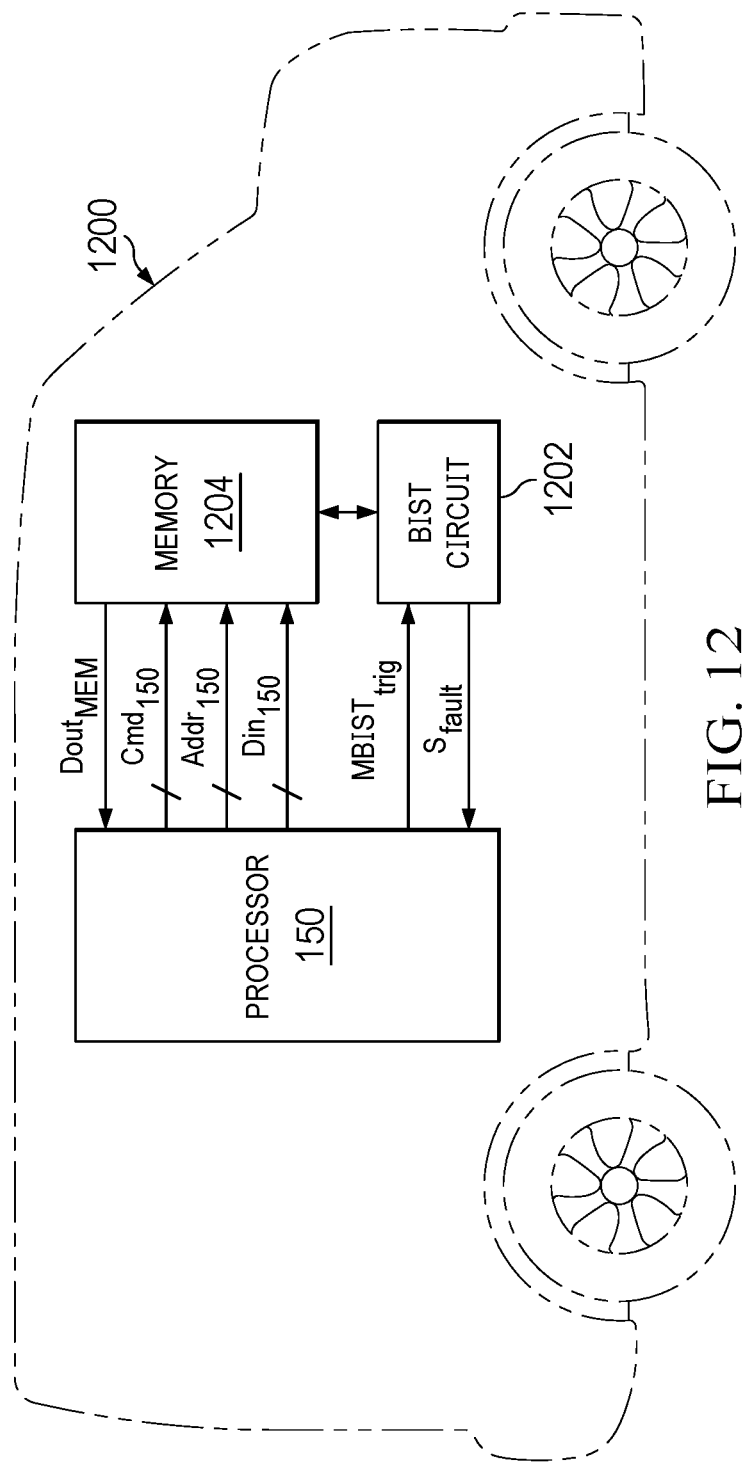
FIG. 12 illustrates an automotive vehicle, according to an embodiment of the present invention.

FIG. 12 illustrates automotive vehicle 1200, according to an embodiment of the present invention. Vehicle 1200 includes processor 150, memory 1204, and BIST circuit 1202. In some embodiments, BIST circuit 1202 may be implemented as BIST circuit 100 or 300. In some embodiments, processor 150 may perform method 1100, e.g., triggering performance of a memory test (e.g., 900, 1000) using trigger signal $MBIST_{trig}$ to cause BIST circuit 1202 to test memory 1204.

In some embodiments, memory 1204 may be implemented as memory 102.

In some embodiments, trigger signal $MBIST_{trig}$ corresponds to test mode signal $S_{test}$. In some embodiments, trigger signal $MBIST_{trig}$ corresponds to a (e.g., digital) communication protocol.

In some embodiments, signal $S_{fault}$ is a provided as a single digital signal that asserted (e.g., asynchronously or synchronously) in response to a fault detection. In some embodiments, signal $S_{fault}$ corresponds to a (e.g., digital) communication protocol.

In some embodiments, processor 150 may perform method 1100 (e.g., periodically) during vehicle operation (e.g., such as while driving).

In some embodiments, vehicle 1200 complies with the requirements of ASIL-D.

In some embodiments, BIST circuit 1202 and memory 1204 may be implemented as an integrated circuit, e.g., in a single monolithic subtracted or in a multi-die integrated circuit. In some embodiments, such integrated circuit may additionally include processor 150. In some embodiments, memory 1204 may be implemented external to an integrated circuit that includes BIST circuit 1202. Other implementations are also possible.

Advantages of some embodiments include performing a non-destructive memory test (e.g., during vehicle operation), without the system software (e.g., running in a processor, e.g., of a vehicle) to be involved in the memory testing process, and without incurring any time overhead associated with the system software saving and restoring the state of the target memory. Additional advantages of some embodiments include achieving a latent fault metric associated with the memory circuits that complies with the requirements of ASIL-D, as defined by ISO 26262, with low silicon area impact, and with little or no time overhead.

Figure 13:
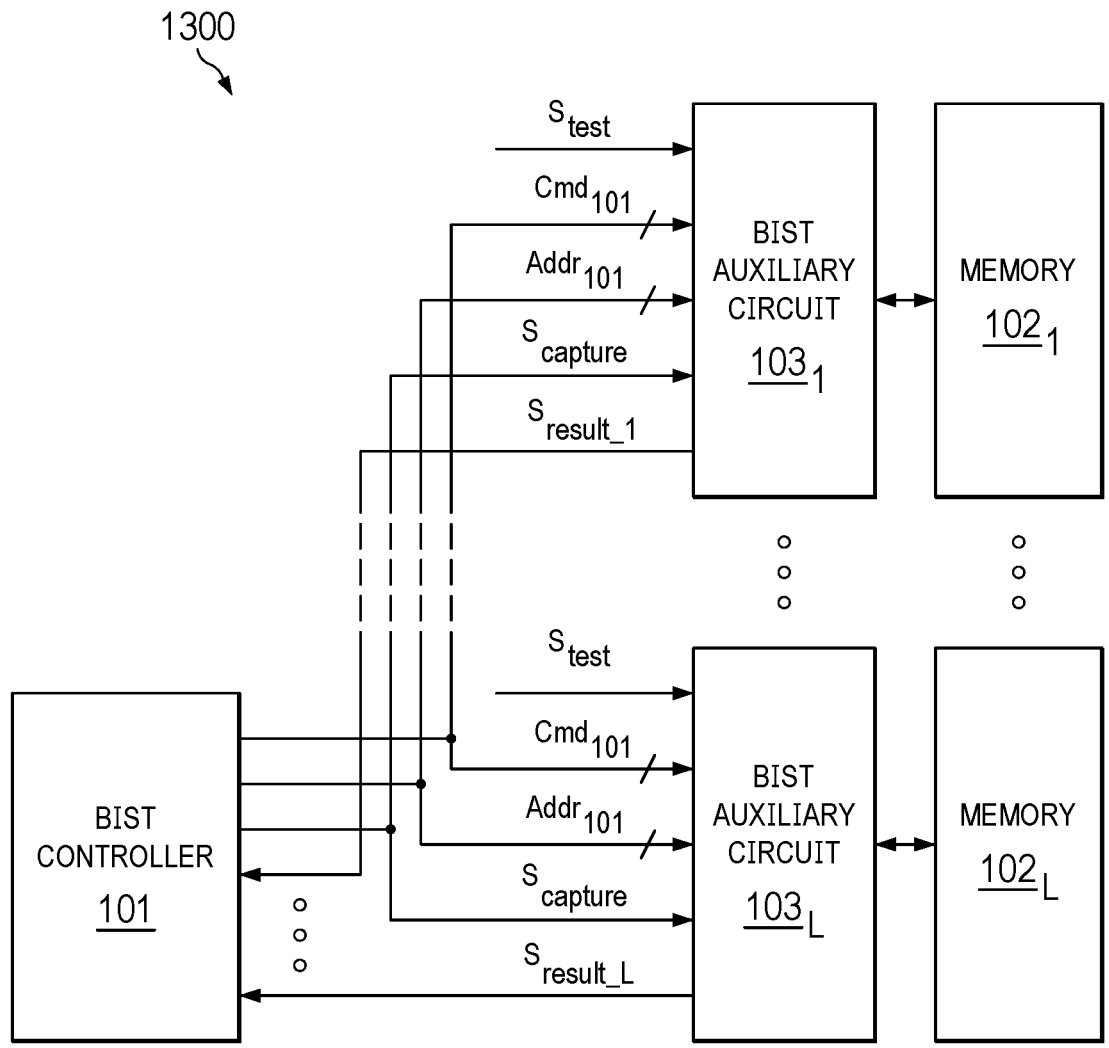
FIGS. 13 to 15 show schematic diagrams of BIST circuits, according to embodiments of the present invention.

In some embodiments, a BIST circuit (e.g., 100, 300, 1202) may be used to test in parallel a plurality of memories. For example, FIG. 13 shows a schematic diagram of BIST circuit 1300, according to an embodiment of the present invention. BIST circuit 1300 includes BIST controller 101, and L BIST auxiliary circuits 103 (e.g., as implemented in FIG. 1 or 3), where L is greater than 1.

In some embodiments, BIST circuit 1202 may be implemented as BIST circuit 1300, and memory 1204 may include L memories 102.

During normal operation, processor 150 may access any of the L memories 102, e.g., via respective MUXes 104, 106, and 110 (not shown in FIG. 13).

During memory test mode (when test mode signal $S_{test}$ is asserted), BIST controller 101 may test two or more (or all) of the L memories 102 in parallel. For example, as shown in FIG. 13, in some embodiments, the same operation sequence (e.g., read, write, capture) and memory addresses are provided to the L memories 102. Each of the memories 102 provide a respective signal $S_{result}$, which may be, e.g., independently, analyzed by BIST controller 101 to determine whether a fault has been detected. For example, in some embodiments, BIST controller 101 may perform method 900 or 1000, while independently analyzing the respective signals $S_{result}$ (e.g., during the compare operation).

Since the memory test performed by some embodiments is non-destructive (the original data is automatically restored after the memory test is performed without intervention from BIST controller 101 or processor 150), some embodiments are advantageously capable of testing multiple memories in parallel without overhead for saving and restoring the state of the memories. By performing non-destructive memory test of multiple memories in parallel, some embodiments are advantageously capable of testing the memories in (e.g., a substantially) shorter time, which may help satisfy some safety requirements, such as some timing requirements associated with ASIL-D.

Figure 14:
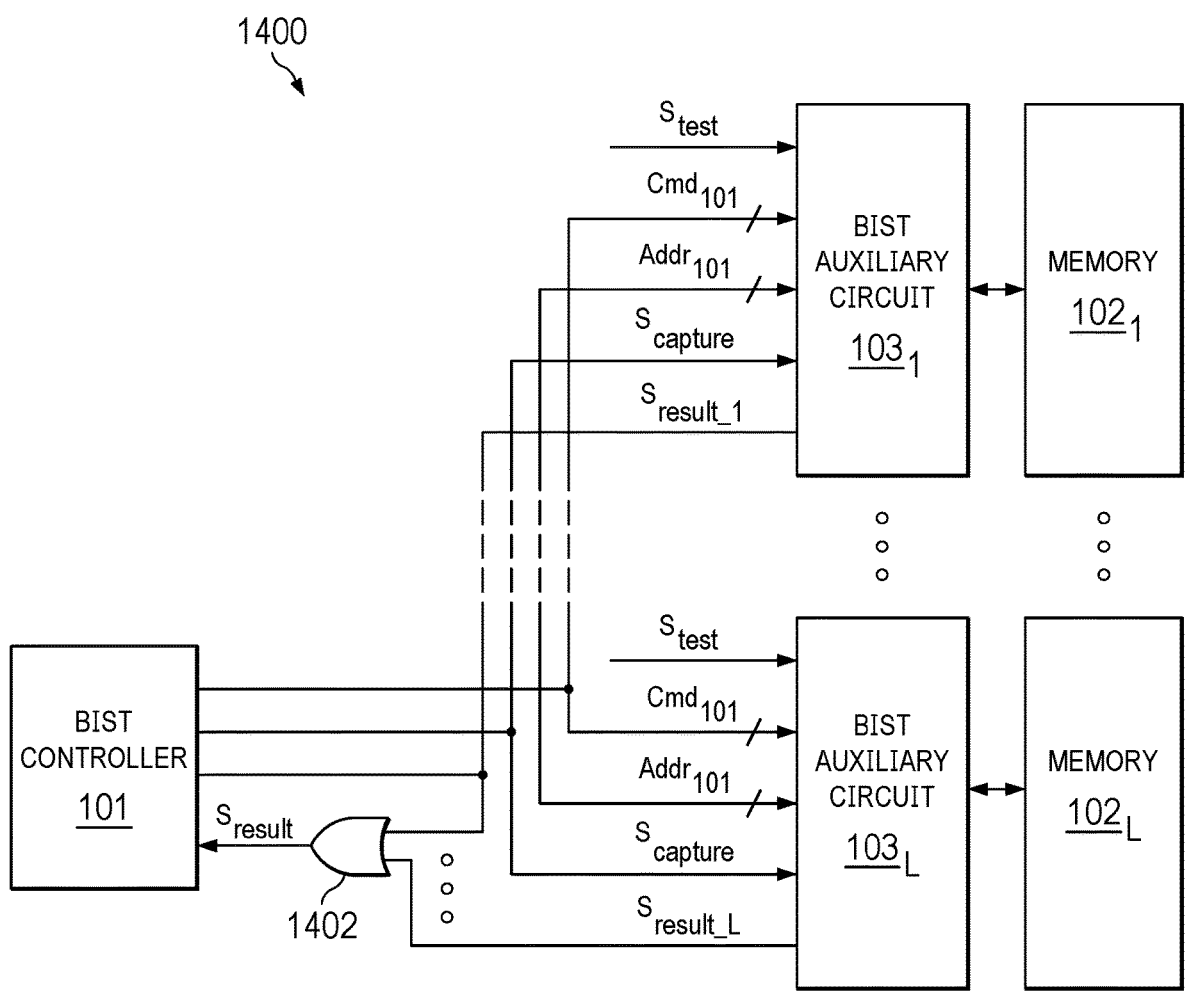
Figure 15:
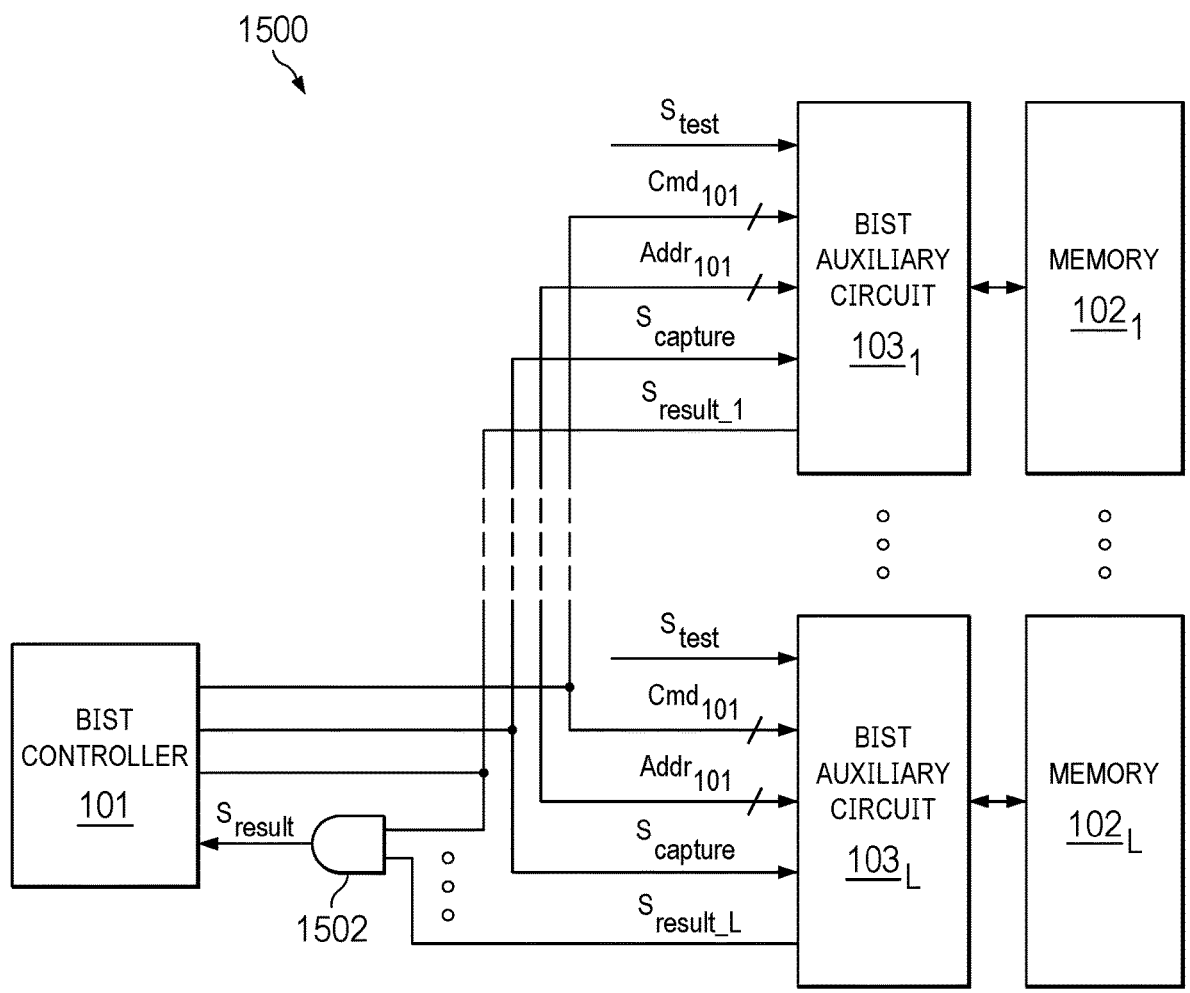

In some embodiments, the signals $S_{result}$ from the L BIST auxiliary circuits 103 may be compressed and such compressed signal may be delivered to BIST circuit 101. For example, FIGS. 14 and 15 show schematic diagrams of BIST circuits 1400 and 1500, according to embodiments of the present invention. In some embodiments, BIST circuit 1202 may be implemented as BIST circuit 1400 or 1500.

In some embodiments, BIST circuits 1400 and 1500 operate in a similar manner as BIST circuit 1300. BIST circuit 1400, however, includes OR gate 1402, which compresses the L signals $S_{result}$ from the L BIST auxiliary circuits L into a signal $S_{result}$ (e.g., in embodiments in which a fault is indicated by $S_{result}$ being equal to 1); and BIST circuit 1500, includes AND gate 1502, which compresses the L signals $S_{result}$ from the L BIST auxiliary circuits L into a signal $S_{result}$ (e.g., in embodiments in which a fault is indicated by $S_{result}$ being equal to 0).

In some embodiments in which a fault is indicated by $S_{result}$ being equal to 1, each of the L BIST auxiliary circuits 103 may implement their respective BIST datapath 118 as BIST datapath 500 or 600, and the respective outputs of the BIST datapath 118 may be coupled to OR gate 1402 (e.g., as shown in FIG. 14) so that BIST controller 101 may determine with a single compare operation (based on a single signal $S_{result}$) whether a fault exist in any of the L memories 102.

In some embodiments in which a fault is indicated by $S_{result}$ being equal to 0, each of the L BIST auxiliary circuits 103 may implement their respective BIST datapath 118 as BIST datapath 700 or 800, and the respective outputs of the BIST datapath 118 may be coupled to AND gate 1502 (e.g., as shown in FIG. 15) so that BIST controller 101 may determine with a single compare operation (based on a single signal $S_{result}$) whether a fault exist in any of the L memories 102.

In some embodiments, such as in BIST circuits 1300, 1400, or 1500, each of the L memories 102 may be equal to each other (e.g., same memory type, same size, etc.).

In some embodiments, one or more (or all) of the L memories 102 may be different from each other (e.g., different size, 1 port versus 2 port, etc.). For example, in some embodiments, each of the BIST auxiliary circuit 103 may include a translator circuit (not shown), which may perform a translation operation between the received command and memory address and the command and memory address provided to the associated memory 102 and may, optionally, deactivate or otherwise not test the associated memory 102 based on the received command and memory address. For example, in some embodiments, if the memory address is outside the acceptable memory range of an associated memory 102, BIST auxiliary circuit 103 may not forward the command to the associated memory 102 and may mask the associated signal $S_{result}$. Thus, in some embodiments, BIST controller 101 may broadcast the same commands and memory addresses to all L memories 102 in parallel (e.g., sequentially to cover the biggest memory 102 of the L memories 102) to test all memories 102. In some such embodiments, each memory 102 performs operations (read, write, capture) when the memory address is within its memory range, and does not perform operations when the memory address is not within its memory range.

For example, in an embodiment in which L is equal 2, a first memory 102 has a size of 1 kB, and a second memory 102 has a size of 2 kB, BIST controller 101 may perform a memory test (e.g., 900, 1000) by broadcasting to the first and second memories 102 a sequence of operations to tested memory addresses in sequentially ascending order. During the first 1 kB memory addresses, the first and second memories 102 are tested in parallel. During the last 1 kB memory addresses, only the first memory 102 is tested while the second memory 102 is not.

Example embodiments of the present invention are summarized here. Other embodiments can also be understood from the entirety of the specification and the claims filed herein.

Example 1. An electronic circuit including: a memory including a data input, an address input, a command input, and a data output; a register having a data input coupled to the data output of the memory; a comparator circuit having a first data input coupled to the data output of the memory, and a second data input coupled to a data output of the register; an inverter circuit having a data input coupled to the data output of the register, and a data output coupled to the data input of the memory; and a controller having a command output coupled to the command input of the memory, an address output coupled to the address input of the memory, and a fault input coupled to a data output of the comparator circuit, where the controller is configured to determine whether the memory has a fault based on the fault input of the controller.

Example 2. The electronic circuit of example 1, where the controller is configured to test the memory by transmitting an even number of write commands to the command input of the memory.

Example 3. The electronic circuit of one of examples 1 or 2, where the comparator circuit includes an XOR circuit having a first data input coupled to the data output of the memory, a second data input coupled to a data output of the register, and a data output coupled to the fault input of the controller.

Example 4. The electronic circuit of one of examples 1 to 3, where the comparator circuit includes a further inverter circuit having a data input coupled to the data output of the register, and a data output coupled to the second data input of the XOR circuit.

Example 5. The electronic circuit of one of examples 1 to 4, further including: a first multiplexer having a first data input coupled to the data output of the inverter circuit, and a data output coupled to the data input of the memory; a second multiplexer having a first address input coupled to the address output of the controller, and an address output coupled to the address input of the memory; and a third multiplexer having a first command input coupled to the command output of the controller, and a command output coupled to the command input of the memory.

Example 6. The electronic circuit of one of examples 1 to 5, further including a fourth multiplexer having a first data input coupled to the data output of the memory, a second data input coupled to the data output of the comparator circuit, and a data output coupled to the fault input of the controller.

Example 7. The electronic circuit of one of examples 1 to 6, where the first, second, third, and fourth multiplexers each have a selection input configured to receive a test mode signal.

Example 8. The electronic circuit of one of examples 1 to 7, where the controller is configured to provide the test mode signal to the first, second, third, and fourth multiplexers.

Example 9. The electronic circuit of one of examples 1 to 8, further including a processor including: a data output coupled to a second data input of the first multiplexer; an address output coupled to a second address input of the second multiplexer; a command output coupled to a second command input of the third multiplexer; and a data input coupled to the data output of the memory.

Example 10. The electronic circuit of one of examples 1 to 9, where the controller is configured to provide a capture signal to the register, and where the register is configured to store data from the data output of the memory into the register when the capture signal is asserted.

Example 11. The electronic circuit of one of examples 1 to 10, where the controller is configured to, each time the controller transmits a write command to the memory, asserts the capture signal before transmitting the write command.

Example 12. The electronic circuit of one of examples 1 to 11, where the fault input of the controller is a single-bit input.

Example 13. The electronic circuit of one of examples 1 to 12, including an OR gate coupled between the data output of the comparator circuit and the fault input of the controller.

Example 14. The electronic circuit of one of examples 1 to 13, including an AND gate coupled between the data output of the comparator circuit and the fault input of the controller.

Example 15. The electronic circuit of one of examples 1 to 14, having a masking circuit coupled between the data output of the comparator circuit and the fault input of the controller, where the masking circuit is configured to mask the data output of the comparator circuit based on a masking signal.

Example 16. The electronic circuit of one of examples 1 to 15, where the controller is configured to provide the masking signal to the masking circuit.

Example 17. The electronic circuit of one of examples 1 to 16, where the electronic circuit is integrated in an integrated circuit.

Example 18. An apparatus including: a memory including a data input, an address input, a command input, and a data output; a register having a data input coupled to the data output of the memory; a comparator circuit having a first data input coupled to the data output of the memory, and a second data input coupled to a data output of the register; an inverter circuit having a data input coupled to the data output of the register, and a data output coupled to the data input of the memory; a controller having a command output coupled to the command input of the memory, an address output coupled to the address input of the memory, and a fault input coupled to a data output of the comparator circuit; a first multiplexer having a first data input coupled to the data output of the inverter circuit, and a data output coupled to the data input of the memory; a second multiplexer having a first address input coupled to the address output of the controller, and an address output coupled to the address input of the memory; and a third multiplexer having a first command input coupled to the command output of the controller, and a command output coupled to the command input of the memory; and a processor including: a data output coupled to a second data input of the first multiplexer; an address output coupled to a second address input of the second multiplexer; a command output coupled to a second command input of the third multiplexer; and a data input coupled to the data output of the memory.

Example 19. The apparatus of example 18, where the processor is configured to execute instructions stored in the memory.

Example 20. The apparatus of one of examples 18 or 19, where the apparatus is an automotive vehicle.

Example 21. A method including: asserting a test mode signal; after the test mode signal is asserted, transmitting a first memory address and a first read command to a first memory to cause the first memory to output first read data at a data output of the first memory; after transmitting the first read command to the first memory, storing the first read data into a first register; after storing the first read data into the first register, transmitting a first write command to the first memory to cause first input data at a data input of the first memory to be stored at the first memory address of the first memory, where the data input of the first memory is coupled to a data output of the first register via a first inverter circuit, and where the first input data corresponds to inverted first read data; after transmitting the first write command to the first memory, transmitting a second read command to the first memory to cause the first memory to output second read data at the data output of the first memory, where the second read data corresponds to the inverted first read data; and after transmitting the second read command to the first memory, comparing the first read data with the second read data using a first comparator circuit that includes a first data input coupled to the data output of the first memory, a second data input coupled to the data output of the first register, and a data output, and determining whether the first memory has a fault based on the data output of the first comparator circuit.

Example 22. The method of example 21, where: transmitting the first memory address and the first read command to the first memory further includes transmitting the first memory address and the first read command to a second memory to cause the second memory to output further first read data at a data output of the second memory; transmitting the first write command to the first memory further includes transmitting the first write command to the second memory to cause further first input data at a data input of the second memory to be stored at the first memory address of the second memory, where the data input of the second memory is coupled to a data output of a second register via a second inverter circuit, and where the further first input data corresponds to inverted further first read data; and transmitting the second read command to the first memory further includes transmitting the second read command to the second memory to cause the second memory to output further second read data at the data output of the second memory, where the further second read data corresponds to the inverted further first read data, the method further including: after transmitting the second read command to the first and second memories, comparing the further first read data with the further second read data using a second comparator circuit that includes a first data input coupled to the data output of the second memory, a second data input coupled to the data output of the second register, and a data output, and determining whether the second memory has a fault based on the data output of the second comparator circuit.

Example 23. The method of one of examples 21 or 22, where a datapath circuit includes a first input coupled to the data output of the first comparator circuit, and a second input coupled to the data output of the second comparator circuit, the method further including, determining that a fault exist in the first or second memory in response to an output of the datapath circuit being asserted.

Example 24. The method of one of examples 21 to 23, where the first memory is a memory of a first type, and the second memory is a memory of a second type different from the first type.

Example 25. The method of one of examples 0 to 24, where the first type includes a first size, and the second type includes a second size different from the first size.

In this description, the term "couple" may cover connections, communications, or signal paths that enable a functional relationship consistent with this description. For example, if device A generates a signal to control device B to perform an action: (a) in a first example, device A is coupled to device B by direct connection; or (b) in a second example, device A is coupled to device B through intervening component C if intervening component C does not alter the functional relationship between device A and device B, such that device B is controlled by device A via the control signal generated by device A.

A device that is "configured to" perform a task or function may be configured (e.g., programmed and/or hardwired) at a time of manufacturing by a manufacturer to perform the function and/or may be configurable (or reconfigurable) by a user after manufacturing to perform the function and/or other additional or alternative functions. The configuring may be through firmware and/or software programming of the device, through a construction and/or layout of hardware components and interconnections of the device, or a combination thereof.

While this invention has been described with reference to illustrative embodiments, this description is not limiting. This description encompasses various modifications and combinations of the illustrative embodiments, as well as other embodiments of the invention. The appended claims encompass any such modifications or embodiments.

What is claimed is:

1. An electronic circuit comprising:
   a memory comprising a data input, an address input, a command input, and a data output;
   a register comprising a data input and a data output, the data input coupled to the data output of the memory;
   a comparator circuit comprising a first data input coupled to the data output of the memory, and a second data input coupled to the data output of the register;
   an inverter circuit comprising a data input coupled to the data output of the register, and a data output coupled to the data input of the memory; and
   a controller comprising a command output coupled to the command input of the memory, an address output coupled to the address input of the memory, and a fault input coupled to a data output of the comparator circuit, wherein the controller is configured to determine whether the memory has a fault based on the fault input of the controller.

2. The electronic circuit of claim 1, wherein the controller is configured to test the memory by transmitting an even number of write commands to the command input of the memory.

3. The electronic circuit of claim 1, wherein the comparator circuit comprises an XOR circuit having a first data input coupled to the data output of the memory, a second data input coupled to the data output of the register, and a data output coupled to the fault input of the controller.

4. The electronic circuit of claim 3, wherein the comparator circuit comprises a further inverter circuit having a data input coupled to the data output of the register, and a data output coupled to the second data input of the XOR circuit.

5. The electronic circuit of claim 1, further comprising:
   a first multiplexer comprising a first data input coupled to the data output of the inverter circuit, and a data output coupled to the data input of the memory;
   a second multiplexer comprising a first address input coupled to the address output of the controller, and an address output coupled to the address input of the memory; and
   a third multiplexer comprising a first command input coupled to the command output of the controller, and a command output coupled to the command input of the memory.

6. The electronic circuit of claim 5, further comprising a fourth multiplexer having a first data input coupled to the data output of the memory, a second data input coupled to the data output of the comparator circuit, and a data output coupled to the fault input of the controller.

7. The electronic circuit of claim 6, wherein the first, second, third, and fourth multiplexers each have a selection input configured to receive a test mode signal.

8. The electronic circuit of claim 7, wherein the controller is configured to provide the test mode signal to the first, second, third, and fourth multiplexers.

9. The electronic circuit of claim 5, further comprising a processor comprising:
   a data output coupled to a second data input of the first multiplexer;
   an address output coupled to a second address input of the second multiplexer;
   a command output coupled to a second command input of the third multiplexer; and
   a data input coupled to the data output of the memory.

10. The electronic circuit of claim 1, wherein the controller is configured to provide a capture signal to the register, and wherein the register is configured to store data from the data output of the memory into the register when the capture signal is asserted.

11. The electronic circuit of claim 10, wherein the controller is configured to, each time the controller transmits a write command to the memory, asserts the capture signal before transmitting the write command.

12. The electronic circuit of claim 1, wherein the fault input of the controller is a single-bit input.

13. The electronic circuit of claim 12, comprising an OR gate coupled between the data output of the comparator circuit and the fault input of the controller.

14. The electronic circuit of claim 12, comprising an AND gate coupled between the data output of the comparator circuit and the fault input of the controller.

15. The electronic circuit of claim 1, comprising a masking circuit coupled between the data output of the comparator circuit and the fault input of the controller, wherein the masking circuit is configured to mask the data output of the comparator circuit based on a masking signal.

16. The electronic circuit of claim 15, wherein the controller is configured to provide the masking signal to the masking circuit.

17. The electronic circuit of claim 1, wherein the electronic circuit is integrated in an integrated circuit.

18. An apparatus comprising:
a memory comprising a data input, an address input, a command input, and a data output;
a register comprising a data input and a data output, the data input coupled to the data output of the memory;
a comparator circuit comprising a first data input coupled to the data output of the memory, and a second data input coupled to the data output of the register;
an inverter circuit comprising a data input coupled to the data output of the register, and a data output coupled to the data input of the memory;
a controller comprising a command output coupled to the command input of the memory, an address output coupled to the address input of the memory, and a fault input coupled to a data output of the comparator circuit;
a first multiplexer comprising a first data input coupled to the data output of the inverter circuit, a second data input, and a data output coupled to the data input of the memory;
a second multiplexer comprising a first address input coupled to the address output of the controller, a second address input, and an address output coupled to the address input of the memory; and
a third multiplexer comprising a first command input coupled to the command output of the controller, a second command input, and a command output coupled to the command input of the memory; and
a processor comprising:
a data output coupled to the second data input of the first multiplexer;
an address output coupled to the second address input of the second multiplexer;
a command output coupled to the second command input of the third multiplexer; and
a data input coupled to the data output of the memory.

19. The apparatus of claim 18, wherein the processor is configured to execute instructions stored in the memory.

20. The apparatus of claim 18, wherein the apparatus is an automotive vehicle.

21. A method comprising:
asserting a test mode signal;
after the test mode signal is asserted, transmitting a first memory address and a first read command to a first memory to cause the first memory to output first read data at a data output of the first memory;
after transmitting the first read command to the first memory, storing the first read data into a first register;
after storing the first read data into the first register, transmitting a first write command to the first memory to cause first input data at a data input of the first memory to be stored at the first memory address of the first memory, wherein the data input of the first memory is coupled to a data output of the first register via a first inverter circuit, and wherein the first input data corresponds to inverted first read data;
after transmitting the first write command to the first memory, transmitting a second read command to the first memory to cause the first memory to output second read data at the data output of the first memory, wherein the second read data corresponds to the inverted first read data; and
after transmitting the second read command to the first memory, comparing the first read data with the second read data using a first comparator circuit that comprises a first data input coupled to the data output of the first memory, a second data input coupled to the data output of the first register, and a data output, and determining whether the first memory has a fault based on the data output of the first comparator circuit.

22. The method of claim 21, wherein:
transmitting the first memory address and the first read command to the first memory further comprises transmitting the first memory address and the first read command to a second memory to cause the second memory to output further first read data at a data output of the second memory;
transmitting the first write command to the first memory further comprises transmitting the first write command to the second memory to cause further first input data at a data input of the second memory to be stored at the first memory address of the second memory, wherein the data input of the second memory is coupled to a data output of a second register via a second inverter circuit, and wherein the further first input data corresponds to inverted further first read data; and
transmitting the second read command to the first memory further comprises transmitting the second read command to the second memory to cause the second memory to output further second read data at the data output of the second memory, wherein the further second read data corresponds to the inverted further first read data, the method further comprising:
after transmitting the second read command to the first and second memories, comparing the further first read data with the further second read data using a second comparator circuit that comprises a first data input coupled to the data output of the second memory, a second data input coupled to the data output of the second register, and a data output, and determining whether the second memory has a fault based on the data output of the second comparator circuit.

23. The method of claim 22, wherein a datapath circuit comprises a first input coupled to the data output of the first comparator circuit, and a second input coupled to the data output of the second comparator circuit, the method further comprising, determining that a fault exist in the first or second memory in response to an output of the datapath circuit being asserted.

24. The method of claim 22, wherein the first memory is a memory of a first type, and the second memory is a memory of a second type different from the first type.

25. The method of claim 24, wherein the first type comprises a first size, and the second type comprises a second size different from the first size.

\* \* \* \* \*